US012756360B2

(12) United States Patent
Ogawa et al.

(10) Patent No.: US 12,756,360 B2
(45) Date of Patent: Oct. 6, 2026

(54) CRYSTAL UNIT WITH BUILT-IN TEMPERATURE SENSOR

(71) Applicant: NIHON DEMPA KOGYO CO., LTD., Tokyo (JP)

(72) Inventors: Motoki Ogawa, Saitama (JP); Akihiro Sakanashi, Saitama (JP); Takumi Ariji, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 19/185,152

(22) Filed: Apr. 21, 2025

(65) Prior Publication Data

US 2025/0337358 A1 Oct. 30, 2025

(30) Foreign Application Priority Data

| | | | |
|---|---|---|---|
| Apr. 26, 2024 | (JP) | ................................ | 2024-072182 |
| Sep. 6, 2024 | (JP) | ................................ | 2024-154016 |
| Feb. 5, 2025 | (JP) | ................................ | 2025-017242 |
| Mar. 5, 2025 | (JP) | ................................ | 2025-034325 |

(51) Int. Cl.
*H03B 5/04* (2006.01)
*H03B 5/32* (2006.01)

(52) U.S. Cl.
CPC ................. *H03B 5/04* (2013.01); *H03B 5/32* (2013.01); *H03B 2200/0018* (2013.01)

(58) Field of Classification Search
CPC ........................................................ H03B 5/04
USPC ........................................................ 331/158
See application file for complete search history.

(56) References Cited

U.S. PATENT DOCUMENTS 9,431,995 B2 * 8/2016 Yamashita ............... H03H 9/19
2009/0167117 A1 * 7/2009 Yasuike ............... H03H 9/0552
29/25.35

FOREIGN PATENT DOCUMENTS

JP 2022140662 9/2022
JP 2023070552 5/2023

* cited by examiner

*Primary Examiner* — Joseph Chang
(74) *Attorney, Agent, or Firm* — JCIPRNET

(57) ABSTRACT

A crystal unit with a built-in temperature sensor in a single chamber structure is provided and includes: a container, a depressed portion, an AT-cut quartz-crystal vibrating piece, a temperature sensor, two adhesion pads, and a pedestal made of a crystal disposed between the two adhesion pads and the AT-cut quartz-crystal vibrating piece. Depending on whether the AT-cut quartz-crystal vibrating piece is adhered to the pedestal at the two positions along the X-axis or is adhered to the pedestal at the two positions along the Z'-axis, the pedestal made of the crystal has the X-axis, or the Z'-axis or a Z-axis of the crystal in a direction parallel to a plane, and is adhered to the two adhesion pads in a positional relationship in which the axis of the pedestal is parallel to the first direction.

26 Claims, 12 Drawing Sheets

CI AND DISTANCE h BETWEEN PEDESTAL AND QUARTZ-CRYSTAL VIBRATING PIECE

CI AND QUARTZ-CRYSTAL VIBRATING PIECE ANGLE θ

CRYSTAL UNIT WITH BUILT-IN TEMPERATURE SENSOR

CROSS-REFERENCE TO RELATED APPLICATIONS

This application is based on and claims priority under 35 U.S.C. § 119 to Japanese Patent Application No. 2024-072182, filed on Apr. 26, 2024, Japanese Patent Application No. 2024-154016, filed on Sep. 6, 2024, Japanese Patent Application No. 2025-017242, filed on Feb. 5, 2025, and Japanese Patent Application No. 2025-034325, filed on Mar. 5, 2025. The entire contents of which are incorporated herein by reference.

TECHNICAL FIELD

This disclosure relates to a crystal unit having a structure in which a temperature sensor, such as a thermistor, is built-in.

DESCRIPTION OF THE RELATED ART

What is called a crystal unit with a built-in temperature sensor that has an AT-cut quartz-crystal vibrating piece and a temperature sensor (typically, a thermistor) built-in in one container has been heavily used in recent years. Such a crystal unit obtains a target frequency with higher accuracy because an oscillation frequency of the quartz-crystal vibrating piece is corrected by a chip set side on the basis of temperature information detected by the temperature sensor.

Typical examples of the crystal unit with the built-in temperature sensor include so-called a single-chamber structure type and an H-shaped structure type. The former has a quartz-crystal vibrating piece and a temperature sensor mounted and airtightly sealed within one chamber (for example, paragraph 75, FIG. 7, and the like in Japanese Unexamined Patent Application Publication No. 2023-70552). The latter has a first chamber in which a quartz-crystal vibrating piece is mounted and a second chamber in which a temperature sensor is mounted, wherein the first chamber and the second chamber are stacked back to back, and the first chamber is airtightly sealed (for example, abstract, FIG. 1, and the like in Japanese Unexamined Patent Application Publication No. 2022-140662).

Further improvement in temperature compensation accuracy is desired for both the single-chamber structure type and the H-shaped structure type. As a countermeasure therefore, reducing hysteresis of frequency versus temperature characteristics of the quartz-crystal vibrating piece is effective. That is, reducing a difference between frequency versus temperature characteristics at temperature rise and frequency versus temperature characteristics at temperature decrease of the quartz-crystal vibrating piece when a temperature of the crystal unit with the built-in temperature sensor is increased from t1 degrees to tn (tn>t1) degrees, and then immediately decreased down to t1 degrees, to as small as possible is effective for improving temperature compensation accuracy.

A need thus exists for a crystal unit with a built-in temperature sensor which is not susceptible to the drawback mentioned above.

SUMMARY

According to an aspect of this disclosure, there is provided a crystal unit with a built-in temperature sensor in a single chamber structure, including: a container, a depressed portion, an AT-cut quartz-crystal vibrating piece, a temperature sensor, two adhesion pads, and a pedestal. The AT-cut quartz-crystal vibrating piece is mounted in the container. The depressed portion is disposed in a portion on a bottom surface side of the container. The depressed portion is for mounting the temperature sensor. The AT-cut quartz-crystal vibrating piece is in a quadrilateral shape in plan view mounted in the container. The temperature sensor is mounted in the depressed portion. The two adhesion pads disposed at portions correspond to a peripheral area of the depressed portion of the container along a first direction. The pedestal made of a crystal is disposed between the two adhesion pads and the AT-cut quartz-crystal vibrating piece, adhered to the two adhesion pads on one end side of one surface, and adhered to the AT-cut quartz-crystal vibrating piece at two positions along an X-axis of a crystal or at two positions along a Z'-axis of the crystal on the other surface. Depending on whether the AT-cut quartz-crystal vibrating piece is adhered to the pedestal at the two positions along the X-axis or is adhered to the pedestal at the two positions along the Z'-axis, the pedestal made of the crystal has the X-axis or one of the Z'-axis or a Z-axis of the crystal in a direction parallel to a plane, and is adhered to the two adhesion pads in a positional relationship in which the axis of the pedestal is parallel to the first direction, where, the Z'-axis is an axis displaced from a true Z-axis of the crystal derived from a cut angle of an AT-cut crystal element.

According to an aspect of this disclosure, there is provided a crystal unit with a built-in temperature sensor in an H-shaped structure, including: a first chamber, a second chamber, an AT-cut quartz-crystal vibrating piece, a temperature sensor, two adhesion pads, and a pedestal. The AT-cut quartz-crystal vibrating piece is mounted in the first chamber. The temperature sensor is mounted in the second chamber. The second chamber has a bottom surface connected to the first chamber. The AT-cut quartz-crystal vibrating piece is in a quadrilateral shape in plan view, and is mounted in the first chamber. The temperature sensor is mounted in the second chamber. The two adhesion pads disposed in the first chamber along a first direction. The pedestal made of a crystal is disposed between the two adhesion pads and the AT-cut quartz-crystal vibrating piece, adhered to the two adhesion pads on one end side of one surface, and adhered to the AT-cut quartz-crystal vibrating piece at two positions along an X-axis of a crystal or at two positions along a Z'-axis of the crystal on the other surface. Depending on whether the AT-cut quartz-crystal vibrating piece is adhered to the pedestal at the two positions along the X-axis or is adhered to the pedestal at the two positions along the Z'-axis, the pedestal made of the crystal has the X-axis or one of the Z'-axis or a Z-axis parallel to a plane, and is adhered to the two adhesion pads in a positional relationship in which the axis of the pedestal is parallel to the first direction, where, the Z'-axis is an axis displaced from a true Z-axis of the crystal derived from a cut angle of an AT-cut crystal element.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1A:
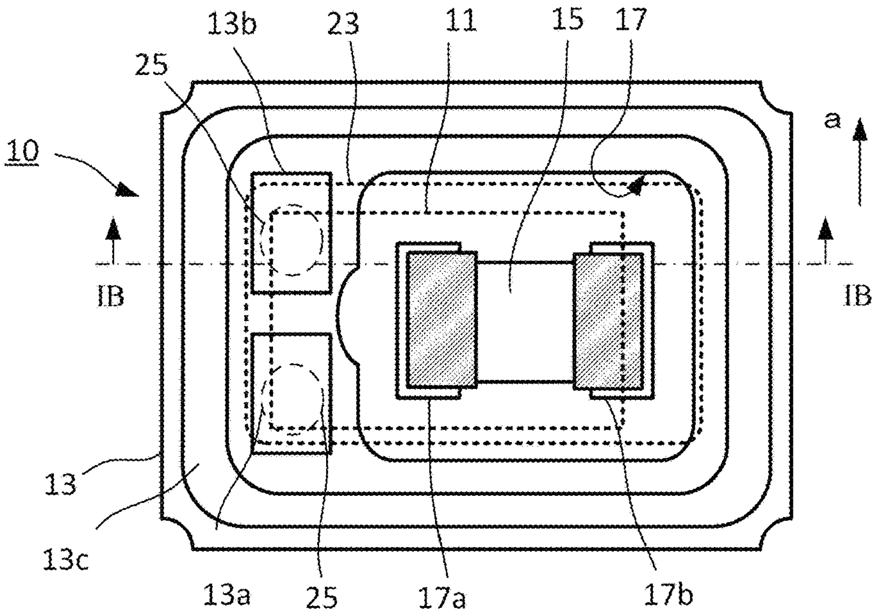
FIG. 1A to FIG. 1C are drawings for describing a crystal unit 10 according to a first embodiment of a first disclosure.

The following describes respective embodiments according to a first disclosure and a second disclosure of the application with reference to the drawings. Each drawing used in the description is merely illustrated schematically for understanding these disclosures. In each drawing used in the description, the same reference numeral is attached to the similar component, and its description is omitted in some cases. Structural examples, used members, and the like described in the following explanations are merely preferable examples within the scope of this disclosure. Therefore, this disclosure is not limited to only the following embodiments.

1. Embodiment of First Disclosure

1-1. First Embodiment

Figure 1B:
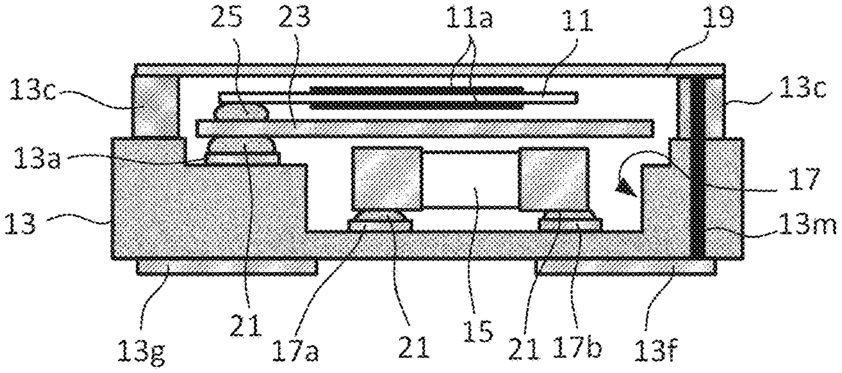
Figure 1C:
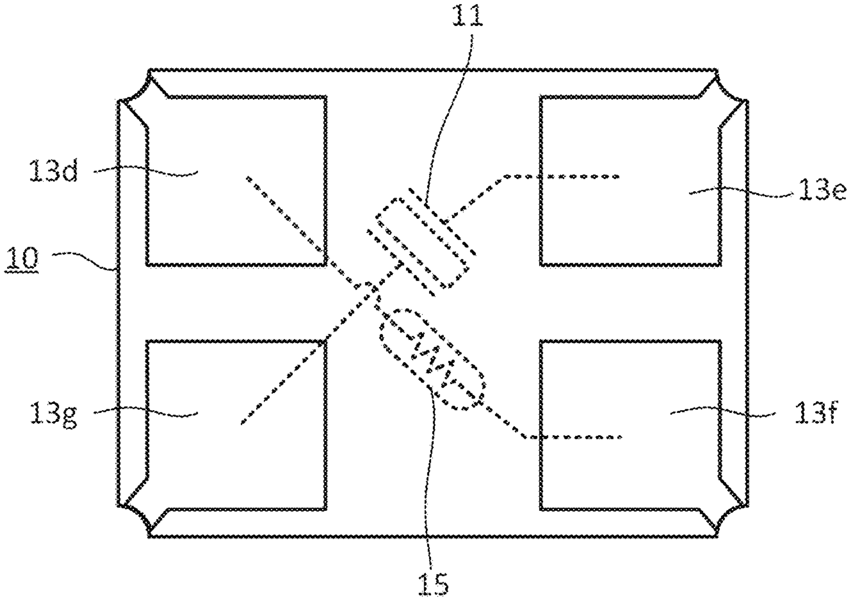
Figure 2A:
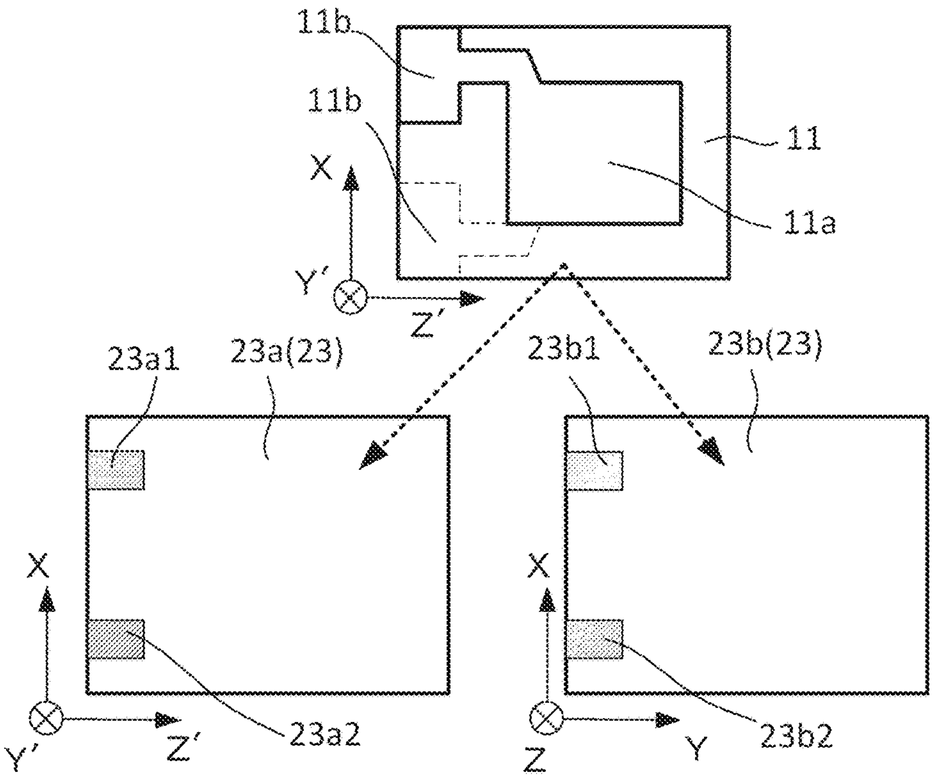
FIG. 2A and FIG. 2B are drawings for describing a relationship between a quartz-crystal vibrating piece and a pedestal in the disclosure, and, specifically, are drawings for describing a relationship relating to crystallographic axes of crystals.
Figure 2B:
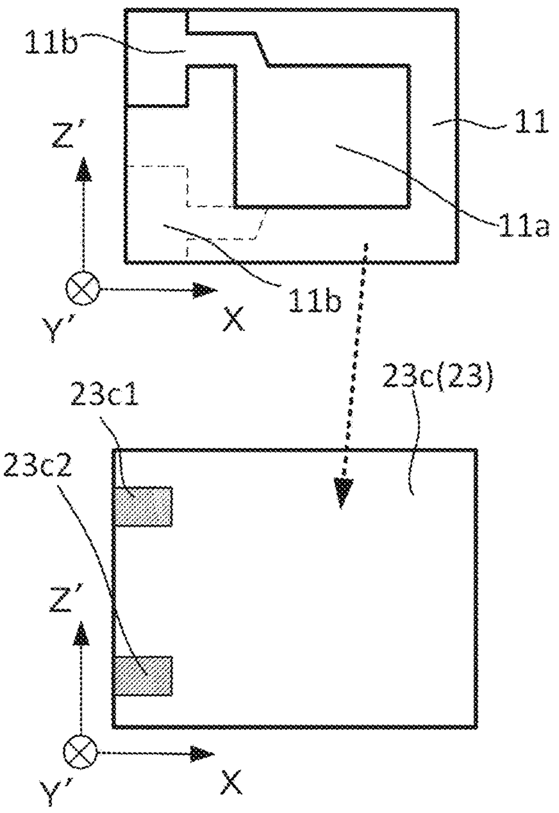

FIG. 1A to FIG. 1C, and FIG. 2A and FIG. 2B are drawings for describing a crystal unit 10 with a built-in temperature sensor (hereinafter sometimes referred to as the crystal unit 10 for short) according to a first embodiment of a first disclosure. In particular, FIG. 1A is a top view of the crystal unit 10, FIG. 1B is a sectional drawing taken along the line IB-IB in FIG. 1A, and FIG. 1C is a bottom view. FIG. 1A illustrates a state where a lid member 19 is removed. FIG. 2A and FIG. 2B are drawings for describing particularly a relationship between a quartz-crystal vibrating piece 11 and a pedestal 23.

This crystal unit 10 includes a container 13 in which the AT-cut quartz-crystal vibrating piece 11 is mounted, a depressed portion 17 that is provided in a portion in a bottom surface side of the container 13 and is for mounting a temperature sensor 15, the quartz-crystal vibrating piece 11 mounted in the container 13, and the temperature sensor 15 mounted in the depressed portion 17.

Furthermore, the crystal unit 10 includes two adhesion pads 13*a*, 13*b* provided with a predetermined interval therebetween along a first direction a (see FIG. 1A) at a portion corresponding to a peripheral area of the depressed portion 17 of the container 13. Here, in the case of this example, the first direction a is a direction along a short side of the container 13.

The depressed portion 17 is formed in a state of being unevenly distributed in one side in a longitudinal direction of the container with respect to the container 13, this uneven distribution widens a part of the peripheral area of the depressed portion 17 of the container 13, and the adhesion pads 13*a*, 13*b* are provided in this widened portion.

Furthermore, the crystal unit 10 includes the pedestal 23 made of a crystal. This pedestal 23 made of the crystal is disposed between the two adhesion pads 13*a*, 13*b* and the quartz-crystal vibrating piece 11, is adhered to the two adhesion pads 13*a*, 13*b* on one end side on one surface via a first conductive adhesive 21, and the quartz-crystal vibrating piece 11 is adhered on the other surface at two positions along the X-axis of the crystal or two positions along the Z'-axis of the crystal via a second conductive adhesive 25.

Moreover, depending on whether the quartz-crystal vibrating piece 11 is adhered to the pedestal at the two positions along the X-axis of the crystal or is adhered to the pedestal at the two positions along the Z'-axis of the crystal, this pedestal 23 made of the crystal has this axis (the X-axis of the crystal or one of the Z'-axis or a Z-axis of the crystal) in a direction parallel to a plane of the pedestal, and is adhered to the two adhesion pads 13*a*, 13*b* in a positional relationship where this axis is parallel to the first direction a. This will be described in detail with reference to FIG. 2A and FIG. 2B later. Note that the Z'-axis is an axis displaced from the true Z-axis of the crystal derived from the cut angle of the AT-cut crystal element.

The quartz-crystal vibrating piece 11 is adhered in a predetermined relationship to this pedestal 23 via the second conductive adhesive 25. The quartz-crystal vibrating piece 11 and the temperature sensor 15 are airtightly sealed, for example, vacuum-sealed with the lid member 19. The following specifically describes respective components.

In particular, as illustrated in FIG. 2A and FIG. 2B, the AT-cut quartz-crystal vibrating piece 11 is in a quadrilateral shape in plan view, a rectangular shape in this example and has a predetermined thickness corresponding to an oscillation frequency, and includes excitation electrodes 11*a* on front and back principal surfaces and extraction electrodes 11*b* extracted to one short side of the quartz-crystal vibrating piece from the excitation electrodes 11*a*.

The quartz-crystal vibrating piece 11 is selected from one that is so-called X-long with a long side parallel to the X-axis, which is the crystallographic axis of the crystal, and a short side parallel to the Z'-axis, which is the crystallographic axis of the crystal, or one that is so-called Z-long with the long side parallel to the Z'-axis of the crystal and the short side parallel to the X-axis of the crystal, or one that has a planar shape in square and has one side parallel to the X-axis of the crystal or parallel to the Z'-axis so as to correspond to the design of the crystal unit.

The container 13 is constituted of a ceramic package having a planar shape in a quadrilateral shape, specifically, a rectangular shape in this case. The container 13 includes a dike 13*c* along an edge thereof, and the quartz-crystal vibrating piece 11 and the temperature sensor 15 are mounted using a space surrounded by the dike 13*c*. In detail, the container 13 includes the depressed portion 17 (also referred to as a second depressed portion in descriptions of a preferable container and the like in the section seven later) in the quadrilateral shape in plan view in which the temperature sensor 15 is mounted at a portion on the bottom surface side, and includes the two adhesion pads 13*a*, 13*b* in the peripheral area of the depressed portion 17. Furthermore, there are provided connecting terminals 17*a*, 17*b* on which the temperature sensor 15 is mounted on the plane of the container 13 corresponding to the bottom surface of the depressed portion 17. The pedestal 23 is mounted on the adhesion pads 13*a*, 13*b*, and the temperature sensor 15 is mounted on the connecting terminals 17*a*, 17*b*. The temperature sensor 15 in the case of this example is in a configuration of being mounted in the depressed portion 17 such that a longitudinal direction is perpendicular to the first direction a, and therefore, the connecting terminals 17*a*, 17*b* are disposed to be arranged along the direction perpendicular to the first direction a.

The container 13 has four corners on an outer bottom surface where external connecting terminals 13*d*, 13*e*, 13*f*, 13*g* for connecting the crystal unit 10 to any electronic equipment, for example, an electronic substrate for a mobile phone are provided (see FIG. 1C). The adhesion pad 13*a*, the adhesion pad 13*b*, the connecting terminal 17*a*, the connecting terminal 17*b*, and the external connecting terminals 13*d*, 13*e*, 13*f*, 13*g* are electrically connected via a via-wiring or castellation-wiring (not illustrated) in a predetermined relationship.

The dike 13*c* of the container 13 has a top surface treated as appropriate for the sealing method. In this case, since seam sealing is used for the sealing, a seam ring (not illustrated) is disposed on the top surface of the dike 13*c*. The sealing method may be a sealing method by a brazing material such as gold tin. In the case, a metallizing pattern for sealing with gold tin may be disposed on the top surface of the dike 13*c*. The dike 13*c* is made of a ceramic. Also, as illustrated in FIG. 1B, a conductor 13*m* for electrically connecting the lid member 19 with the terminal 13*f*, which is one terminal for a temperature sensor among external connecting terminals, is embedded on the dike 13*c* and the predetermined position of the container 13. The external connecting terminal 13*f* is connected to a ground of an electronic device (not illustrated) connecting the crystal unit 10 and this connecting structure can ensure an electromagnetic shield structure of the crystal unit 10.

The container 13 including the depressed portion 17, the adhesion pads 13*a*, 13*b*, the dike 13*c*, the conductor 13*m*, the connecting terminals 17*a*, 17*b*, the external connecting terminals 13*d*, 13*e*, 13*f*, 13*g* can be manufactured by, for example, a ceramic package manufacturing technology.

The temperature sensor 15 is preferred to be constituted of a thermistor. However, it is not limited to the thermistor, and another thing, such as a diode, may be used for the temperature sensor 15. This is because the temperature sensor is achievable by using temperature dependence of a PN junction portion of the diode.

The lid member 19 can be any member corresponding to the sealing method. When the seam sealing is used for the sealing method, the lid member 19 can be constituted of, for example, a nickel-plated kovar material member.

While the first conductive adhesive 21 and the second conductive adhesive 25 are not limited thereto, it is preferred to use a silicone-based conductive adhesive. For the first conductive adhesive 21 and the second conductive adhesive 25, the same adhesives may be used or the different adhesives may be used, but it is preferred to use the same adhesives.

While the pedestal 23 is not limited thereto, it is preferred to use one in a quadrilateral shape in plan view. This is because machining of the pedestal is easy. However, the planar shape of the pedestal 23 may be any shape including, for example, a triangle, a trapezoidal shape tapered toward the distal end side in width, and the like.

The size of the pedestal 23 is not limited thereto, but in the example of, for example, FIG. 1A to FIG. 1C, it is planarly larger than the quartz-crystal vibrating piece 11. In some cases, the size of the pedestal is preferably smaller than the quartz-crystal vibrating piece. This will be described later. It is known that there is a preferable value for the thickness of the pedestal 23 according to the examination by the inventors. This will also be described later.

For the pedestal 23, respective appropriate ones are used depending on whether the quartz-crystal vibrating piece 11 is connected to the pedestal at the two positions along the X-axis of the crystal or the quartz-crystal vibrating piece is connected to the pedestal at the two positions along the Z'-axis of the crystal. This will be specifically described with reference to FIG. 2A and FIG. 2B. The coordinate axes indicated by X, Y', Z' in FIG. 2A and FIG. 2B are crystallographic axes of the crystal derived from the AT-cut. The axis Y' and the axis Z' indicate that the axes are displaced from the original Y-axis and Z-axis of the crystal corresponding to the cut angle of the AT-cut.

FIG. 2A is a description of the pedestal when the quartz-crystal vibrating piece 11 is connected to the pedestal 23 at the two positions along the X-axis of the crystal. That is, it is an example in which the two extraction electrodes 11*b* are at the two positions of the quartz-crystal vibrating piece 11 apart from one another along the X-axis of the crystal, and the quartz-crystal vibrating piece 11 is adhered to a pedestal 23*a* and a pedestal 23*b* at these positions. The pedestal 23 in this case includes the X-axis of the crystal parallel to the plane and can connect the quartz-crystal vibrating piece 11 at the two positions along this X-axis. Specifically, the pedestal 23 in this case is the pedestal 23*a* constituted of an AT-cut crystal element illustrated in a lower left side in FIG. 2A, and includes adhesion wirings 23*a*1, 23*a*2 at the two positions along the X-axis of the crystal. The pedestal 23 in this case may be the pedestal 23*b* constituted of a Z-cut crystal element illustrated in a lower right side in FIG. 2A, and include the adhesion wirings 23*a*1, 23*a*2 at the two positions along the X-axis of the crystal.

The pedestal is adhered to the adhesion pads and the quartz-crystal vibrating piece 11 is adhered to the pedestal such that the quartz-crystal vibrating piece 11 and the pedestal 23*a* or 23*b* have the X-axes of the respective crystals in a positional relationship parallel to the first direction a (see FIG. 1A).

FIG. 2B is an explanatory drawing of the pedestal when the quartz-crystal vibrating piece 11 is connected to the pedestal 23 at the two positions along the Z'-axis of the crystal. A pedestal 23*c* in this case includes the Z-axis or Z'-axis of the crystal within the plane and can connect the quartz-crystal vibrating piece 11 at the two positions along this Z-axis or Z'-axis. Specifically, the pedestal 23*c* is constituted of an AT-cut crystal element, and includes adhesion wirings 23$c$1, 23$c$2 along the Z'-axis of the crystal of the pedestal corresponding to the extraction electrodes 11$b$ of the quartz-crystal vibrating piece 11.

The pedestal is adhered to the adhesion pads and the quartz-crystal vibrating piece 11 is adhered to the pedestal such that the quartz-crystal vibrating piece 11 and the pedestal 23$c$ have the Z'-axes of the respective crystals in a positional relationship parallel to the first direction a (see FIG. 1A).

Note that, on the respective pedestals 23$a$, 23$b$, 23$c$ described above, the X-axis and the Z'-axis of the pedestal are not necessarily truly the same as the X-axis and the Z'-axis of the quartz-crystal vibrating piece. Within the scope of the object of the disclosure, the case where the respective axes of the two have slight angle deviations and the case where parallelism between the two are deviated are allowed.

Figure 3:
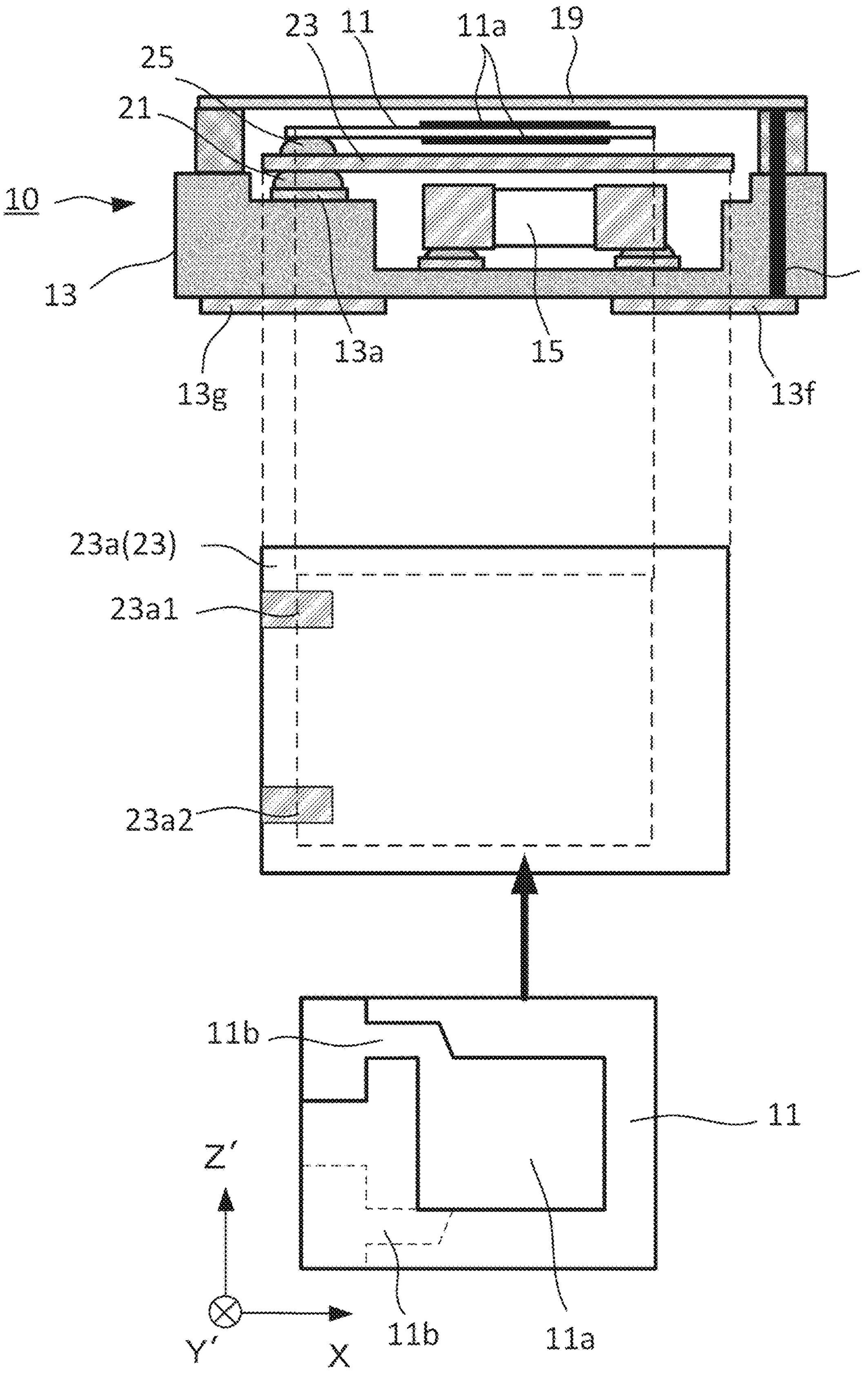
FIG. 3 is a drawing for describing a connection relationship of the quartz-crystal vibrating piece, the pedestal, and a container of the crystal unit 10 using an exploded view of the crystal unit 10.

In the crystal unit 10 of this embodiment, as can be seen from the exploded view of the crystal unit 10 illustrated in FIG. 3, the pedestal 23 made of the crystal is connected and secured on the container 13 at the positions of the adhesion pads 13$a$, 13$b$ of the container 13 on one short side in a state of being cantilevered by the first conductive adhesive 21. The quartz-crystal vibrating piece 11 is also connected and secured at the positions of the adhesion wirings (23$c$1, 23$c$2) of the pedestal 23 made of the crystal on one short side in a state of being cantilevered by the second conductive adhesive 25. Accordingly, the crystal unit 10 has a structure in which the adhesion pad 13$a$, the first conductive adhesive 21, one end of the pedestal 23, the second conductive adhesive 25, and one end of the quartz-crystal vibrating piece 11 are in a state of overlapping in a vertical direction and has a structure in which the pedestal 23 made of the crystal and the quartz-crystal vibrating piece 11 are cantilevered on the same one ends. The effect by this structure will be described in detail with reference to experimental results and analysis results by the finite element method later.

1-2. Second Embodiment

Figure 4:
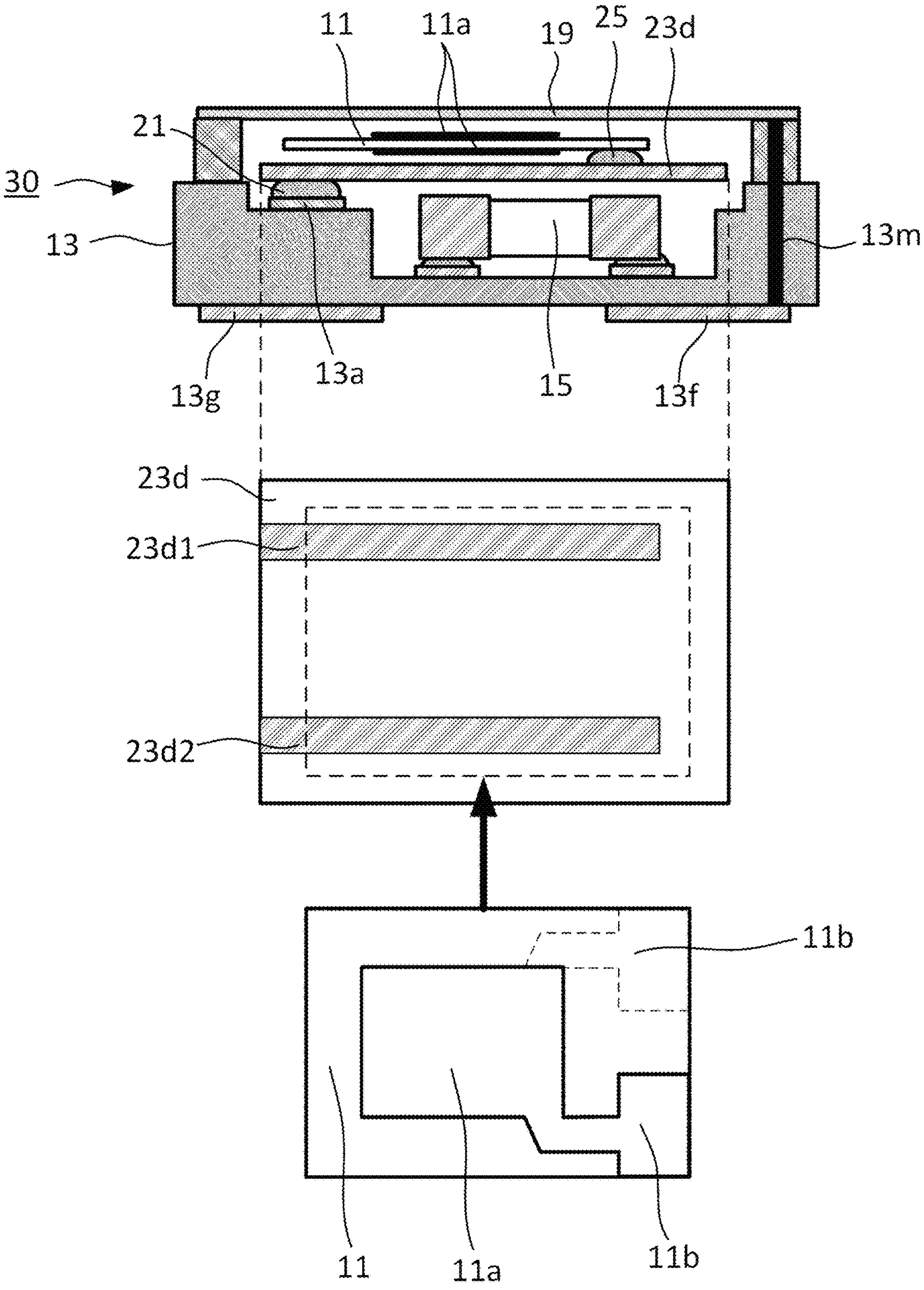
FIG. 4 is a drawing for describing a crystal unit 30 according to a second embodiment of the first disclosure.

Next, a crystal unit 30, which is a second embodiment of the first disclosure, will be described. This will be described with reference to FIG. 4. FIG. 4 is an explanatory drawing illustrating the disassembled crystal unit 30. A difference between the crystal unit 30 and the crystal unit 10 is connection positions between the pedestal and the quartz-crystal vibrating piece.

The crystal unit 10 in the first embodiment has, as illustrated in FIG. 3 and as described above, the structure in which the adhesion pads 13$a$, 13$b$, the first conductive adhesives 21, one end of the pedestal 23, the second conductive adhesives 25, and one end of the quartz-crystal vibrating piece 11 are in the state of overlapping in the vertical direction and has the structure in which the pedestal 23 made of the crystal and the quartz-crystal vibrating piece 11 are cantilevered on the same one ends. In contrast to this, the crystal unit 30 of the second embodiment has, as illustrated in FIG. 4, the one end of a pedestal 23$d$ connected to the adhesion pads 13$a$, 13$b$ via the first conductive adhesive 21, and the one end of the quartz-crystal vibrating piece 11 connected to the other end of the pedestal 23$d$ in a longitudinal direction via the second conductive adhesive 25. That is, a bonding point by the first conductive adhesive 21 and a bonding point by the second conductive adhesive 25 are in a structure of being separated and disposed at two ends of the pedestal 23$d$ in the longitudinal direction. Therefore, adhesion wirings 23$d$1, 23$d$2 of the pedestal 23$d$ in this case are in a long shape across the longitudinal direction of the pedestal 23$d$. Since this crystal unit 30 has the structure in which the quartz-crystal vibrating piece 11 is adhered on a portion in a free end side of the pedestal 23$d$, there is a concern when the distal end of the pedestal 23$d$ is swayed. However, an effect similar to or an effect more than that of the crystal unit 10 in reducing the heat stress can be obtained.

2. Embodiments of Second Disclosure

Next, embodiments of a second disclosure (a crystal unit with a built-in temperature sensor having an H-shaped structure) will be described with reference to FIG. 5A and FIG. 5B.

Figure 5A:
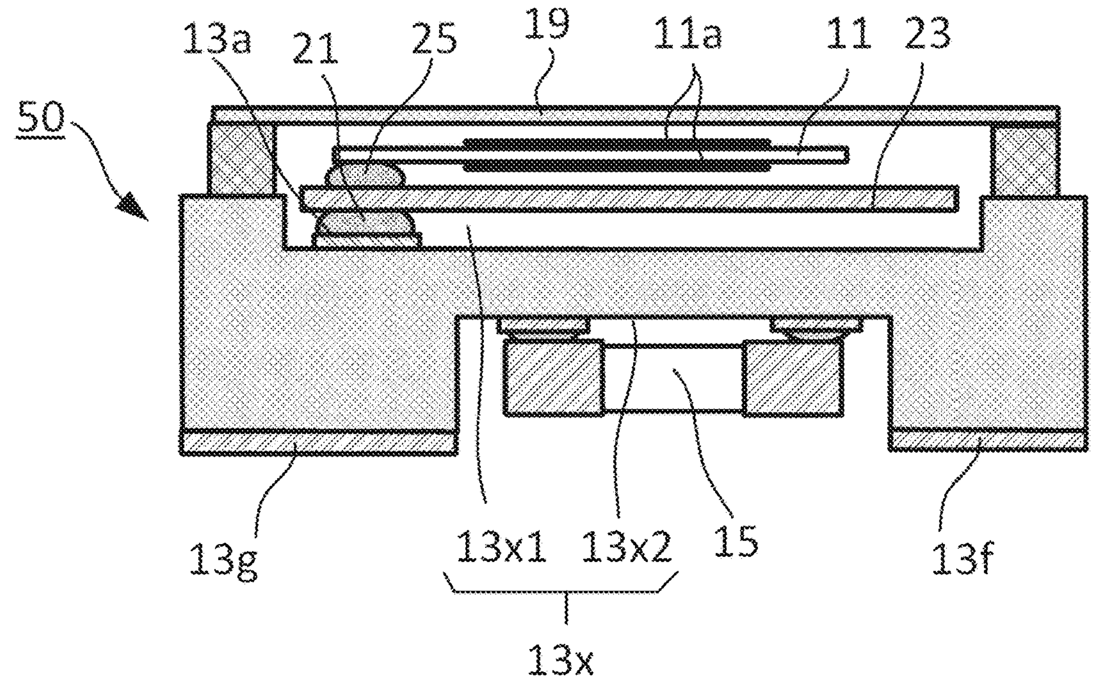
FIG. 5A and FIG. 5B are drawings for describing a first embodiment and a second embodiment of a second disclosure.

FIG. 5A is a sectional drawing of a crystal unit 50 of a first embodiment of the second disclosure, and is a sectional drawing corresponding to FIG. 1A.

A difference between the second disclosure and the first disclosure is that a chamber 13$x$ is configured as the chamber 13$x$ having a cross-sectional surface taken in a thickness direction looking like an H shape made by stacking a first chamber 13$x$1 in which the AT-cut quartz-crystal vibrating piece is mounted and a second chamber 13$x$2 having a bottom surface connected to this first chamber and in which the temperature sensor 15 is mounted, and the quartz-crystal vibrating piece 11 and the temperature sensor 15 are mounted in the corresponding chambers. Accordingly, the configuration other than that is substantially the same as the configuration of the first embodiment described with reference to FIG. 1A to FIG. 1C and FIG. 2A and FIG. 2B, and therefore, the description is omitted.

Figure 5B:
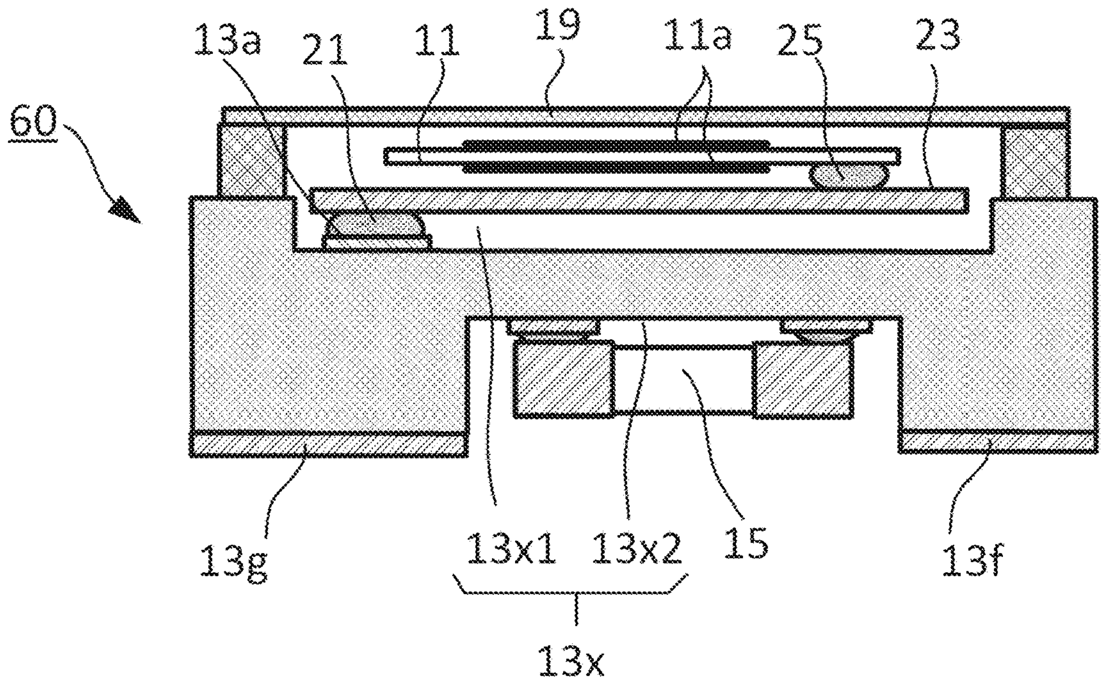

FIG. 5B is a sectional drawing of a crystal unit 60 of a second embodiment of the second disclosure, and is a sectional drawing corresponding to the sectional drawing in FIG. 4. A difference between this crystal unit 60 and the crystal unit 50 is that the pedestal is adhered to the adhesion pad 13$a$ or the like at one end of the pedestal 23, and the quartz-crystal vibrating piece 11 is adhered to the pedestal 23 at the other end of the pedestal 23 in the longitudinal direction. That is, the structure described using FIG. 4 is applied to the second disclosure.

The effects of this application is obtainable also with those having the H-shaped structure illustrated in FIG. 5A and FIG. 5B.

3. Experimental Results and Analysis Results of Finite Element Method for Describing Features of the Present Disclosure

3-1. Regarding Pedestal

One of the features of the disclosure is that a predetermined pedestal made of a crystal is used as the pedestal, and the examination result that has led to this feature will be described below.

3-1-1. Frequency Hysteresis Depending on Presence/Absence of Pedestal

The inventors of the application manufactured a plurality of the crystal units 10 (Example) described with reference to FIG. 1A to FIG. 1C and FIG. 2A and FIG. 2B and a plurality of crystal units without using a pedestal, that is, crystal units (Comparative Example) in which the quartz-crystal vibrating piece 11 is directly adhered to the adhesion pads 13*a*, 13*b* at the positions of one end of the quartz-crystal vibrating piece 11 via a silicone-based conductive adhesive. Both Example and Comparative Example are prototyped using a ceramic package of, what is called, a 1612 size. Both Example and Comparative Example have the AT-cut quartz-crystal vibrating piece used in the experiment of X-long, in a size mountable in the 1612 sized ceramic package, with an oscillation frequency of 76.8 MHz (a thickness of the quartz-crystal vibrating piece of approximately 22 μm), and having a predetermined excitation electrode. The used quartz-crystal vibrating piece has an outside dimension of, specifically, approximately 0.75 mm in the X dimension and approximately 0.51 mm in the Z' dimension. The pedestal used in Example is an AT-cut crystal element having the X dimension of 1.0 mm, the Z' dimension of 0.8 mm, and the thickness of 40 μm. Here, the 1612 sized ceramic package has an outer shape of the package with approximately 1.6 mm of the long side dimension and approximately 1.2 mm of the short side dimension, and the inside of the 1612 sized ceramic package has the structure described using FIG. 1A to FIG. 1C.

Next, hysteresis characteristics of respective frequency versus temperature characteristics of the samples of these Example and Comparative Example were measured. While the illustration is omitted, the measurement was performed using a temperature control device including a substrate with a Peltier element and a temperature controller that controls a temperature of the Peltier element, a frequency measurement device, and a temperature measurement device.

Specifically, the samples of Example and Comparative Example are connected to the substrate having the Peltier element. The frequency measurement device is connected to the terminals 13*e*, 13*g* connected to the quartz-crystal vibrating piece 11 among the external connecting terminals (13*d* to 13*g* in FIG. 1C) of this sample, and the temperature measurement device is connected to the terminals 13*d*, 13*f* connected to the temperature sensor 15.

Next, the temperature of the Peltier element is raised to t1 degrees to tn (tn>t1) degrees at a predetermined temperature interval and in a predetermined temperature rising condition using the temperature control device, and then immediately is decreased to t1 degrees in the same temperature changing condition as the temperature increase. Actual temperatures of the respective crystal units 10 at these temperature rise and temperature decrease were measured using the temperature sensor 15 and the temperature measurement device, and the frequency of the quartz-crystal vibrating piece 11 was measured using the frequency measurement device. On the basis of these measurement results, frequency versus temperature characteristics at temperature rise and frequency versus temperature characteristics at temperature decrease were extracted.

Next, respective frequency differences at the same temperature, that is, frequency hysteresis information of the frequency versus temperature characteristics at temperature rise and the frequency versus temperature characteristics at temperature decrease were obtained, and a mean value of the frequency difference were calculated for each evaluation sample.

Using these mean values, a mean value, the maximum value, the minimum value of the above-described frequency differences of the sample group of Example and a mean value, the maximum value, the minimum value of the above-described frequency differences of the sample group of Comparative Example were obtained. These results are shown in Table 1. The frequency difference is shown in a unit of ppm, which is a ratio obtained by dividing the frequency difference by the oscillation frequency. From Table 1, it is seen that the frequency difference between the temperature rise and the temperature decrease defined above of Example with respect to that of Comparative Example is 0.06/0.026≈0.23, and is as small as approximately one-fifth when compared in the mean values. It is seen that the maximum value of Example with respect to that of Comparative Example is 0.09/0.96≈0.09, and is as small as approximately one-eleventh as well.

TABLE 1

| | Frequency difference between temperature rise and temperature decrease | | |
|---|---|---|---|
| | Mean value | Maximum value | Minimum value |
| Example (AT-cut crystal element pedestal) | 0.06 | 0.09 | 0.02 |
| Comparative Example (no pedestal) | 0.26 | 0.96 | 0.01 |

Unit: ppm

3-1-2. Material of Pedestal and Crystallographic Axis of Pedestal

The following evaluations by the finite element method were performed as another evaluation. Four types of analytical models, which are models of the finite element method imitating the crystal unit 10 described using FIG. 1A to FIG. 1C, with crystallographic axis conditions of the crystal in a direction of arrangement of the two bonding points of the AT-cut quartz-crystal vibrating piece, and conditions of a material and a crystallographic axis of the pedestal being set as illustrated in Table 2 below were manufactured. Von Mises stresses generated at center points of the quartz-crystal vibrating pieces in the analytical models when the respective analytical models were changed in temperature from 25° C. to 105° C. were obtained. The results are shown in Table 2.

TABLE 2

| | Quartz-crystal vibrating piece | Axis connecting two bonding points | Material of pedestal | Crystallographic axis of pedestal adjusted for quartz-crystal vibrating piece | Stress (kPa) |
|---|---|---|---|---|---|
| Analytical Model 1 | X-long | Z'-axis of crystal | Ceramic | Amorphous, therefore no applicable axis | 365.9 |
| Analytical Model 2 | X-long | Z'-axis of crystal | Crystal Z-cut plate | Z'-axis being perpendicular to plate surface of pedestal, therefore no applicable axis | 385.7 |
| Analytical Model 3 | Z-long | X-axis of crystal | Crystal Z-cut plate | X-axis of Z-cut plate | 11.7 |
| Analytical Model 4 | X-long | Z'-axis of crystal | Crystal AT-cut plate | Z'-axis of AT-cut plate | 9.8 |

From Table 2, it is seen that the stresses generated at the centers of the quartz-crystal vibrating pieces due to the above-described temperature change are approximately 366 to 386 kPa in Analytical Model 1 and Analytical Model 2, on the other hand, are approximately 10 kPa in Analytical Model 3 and Analytical Model 4, which are as small as approximately one-thirty seventh. It is seen that with respect to the crystallographic axis equivalent to a line segment connecting the two bonding points of the quartz-crystal vibrating piece, using the pedestal made of the crystal having the crystallographic axis that matches this crystallographic axis in an appropriate axis relationship enables reduction of the stress.

Accordingly, from the results in Table 1 and the results in Table 2, it is seen that appropriately selecting and using the pedestal made of the AT-cut crystal or the pedestal made of the Z-cut crystal as the pedestal taking the adhesion direction of the two points of the AT-cut quartz-crystal vibrating piece into account is effective in reducing the heat stress at the adhesion structure part of the crystal unit.

3-1-3. Pedestal Thickness and Stress in Quartz-Crystal Vibrating Piece

Figure 6A:
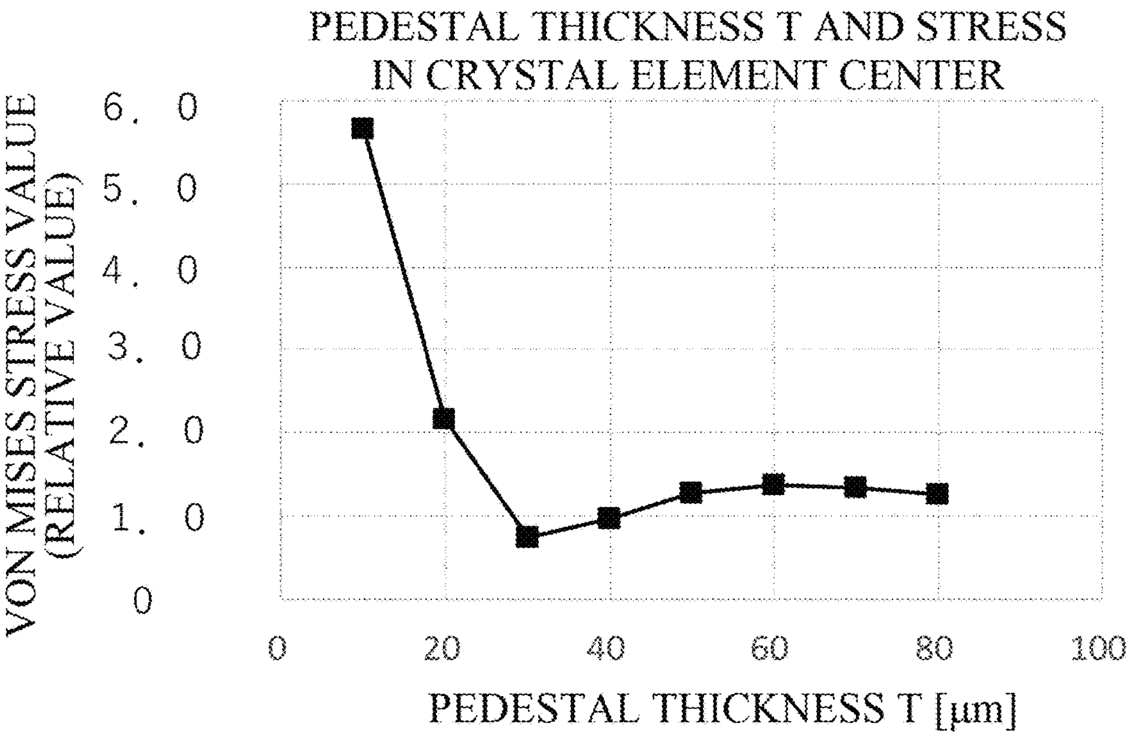
FIG. 6A and FIG. 6B are drawings for describing a thickness and a degree of stress reduction of a pedestal made of a crystal.
Figure 6B:
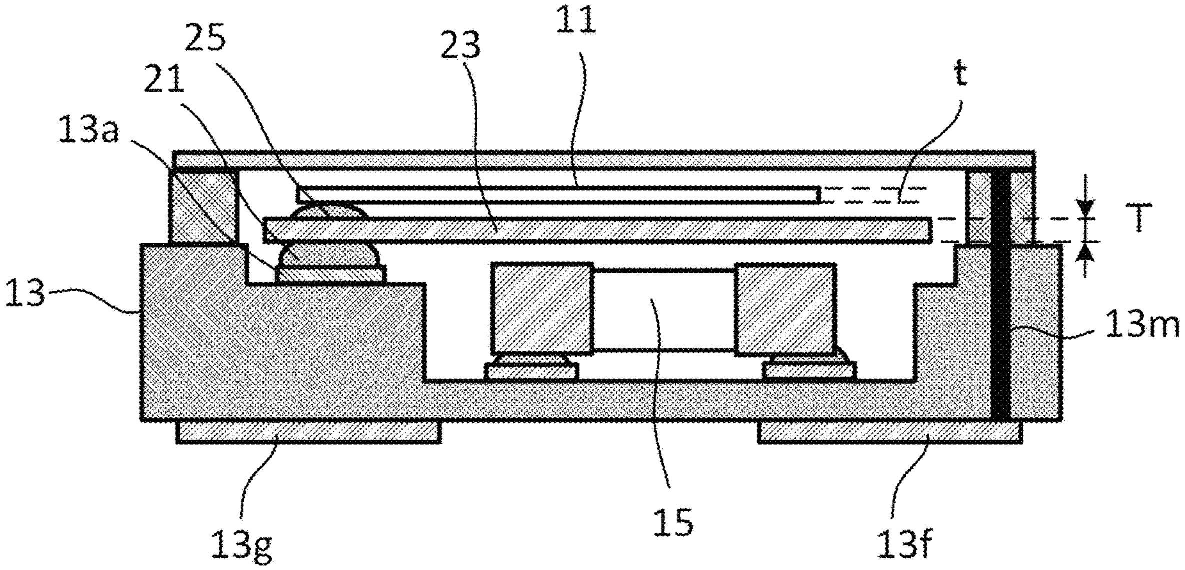

As yet another evaluation by the finite element method, how the thickness of the pedestal made of the crystal affects the stress in the quartz-crystal vibrating piece was examined. Specifically, eight types of analytical models, which are Analytical Model 4 in Table 2, with different thicknesses T of the pedestal made of the AT-cut crystal differing from one another by 10 μm increments from 10 μm to 80 μm were prepared. Von Mises stresses generated at center points of the quartz-crystal vibrating pieces in the models when the respective analytical models were changed in temperature from 25° C. to 105° C. were obtained. FIG. 6A is a drawing showing the results, and is a drawing indicating the thickness of the pedestal by the horizontal axis and the stress value (the relative value) by the vertical axis. FIG. 6B is a drawing showing definitions of the thickness T of the pedestal 23 and the thickness t of the quartz-crystal vibrating piece 11.

FIG. 6A shows the tendency that, when the stress when the thickness T of the pedestal is 10 μm is used as a reference, the stress is approximately one-third when the thickness T of the pedestal is 20 μm, the stress is approximately one-sixth when the thickness T of the pedestal is 30 μm, the stress is increased to approximately one-fifth of the reference up to 60 μm of the thickness T of the pedestal, and the stress is reduced when the thickness T of the pedestal further increases.

Accordingly, it is possible to say that the thicker the thickness T of the pedestal is, the better it is, but there is a limit as if it is too thick, the pedestal fails to fit within the container of the crystal unit. By examining the proper value of the thickness of the pedestal on the basis of these, the following is concluded.

In the case of this analytical model, the thickness of the quartz-crystal vibrating piece is approximately 22 μm (resulting from oscillation frequency of 76.8 MHz), and therefore, the thickness of the quartz-crystal vibrating piece of 22 μm is set as a reference. Then, the thickness T of the pedestal is preferably 20 μm≤T or a thickness equal to or more than the thickness of the quartz-crystal vibrating piece, and by considering it to be housed in the container, the thickness T of the pedestal is preferably 20 μm≤T≤70 μm or the thickness of the quartz-crystal vibrating piece≤T≤70 μm. When the thickness T of the pedestal is in a range from approximately 20 am, which is slightly thinner than the thickness of the quartz-crystal vibrating piece, to 60 μm, the stress is smaller than the other cases, and therefore, the thickness T of the pedestal is preferably 20 μm≤T≤60 μm, and is more preferably 30 μm≤T≤60 μm. It is also possible to conclude as follows by generalizing the above-described examination results.

When the thickness of the quartz-crystal vibrating piece is t, and the thickness of the pedestal is T, T≥0.9t is preferred. It is preferably 0.9t≤T≤3.1t or t≤T≤3.1t, more preferably 0.9t≤T≤2.7t or t≤T≤2.7t, and further more preferably 1.3t≤T≤2.7t. Here, the numerical value of 0.9 is based on 20/22≈0.9 in the above-described numerical value. The numerical value of 3.1 is based on 70/22≈3.18. The numerical value of 2.7 is based on 60/22≈2.7. The numerical value of 1.3 is based on 30/22≈1.36.

Figure 7A:
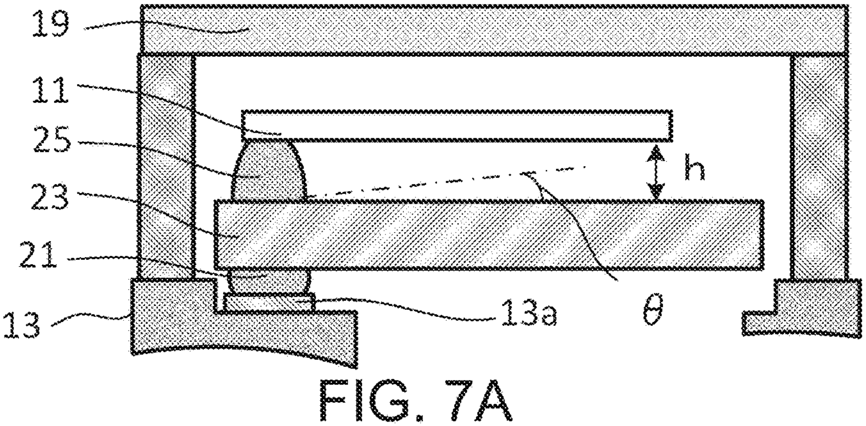
FIG. 7A to FIG. 7C are drawings for describing a relationship between a distance h between the quartz-crystal vibrating piece and the pedestal made of a crystal and a crystal impedance, and a relationship between an angle θ formed by the quartz-crystal vibrating piece and the pedestal made of the crystal and the crystal impedance.
Figure 7B:
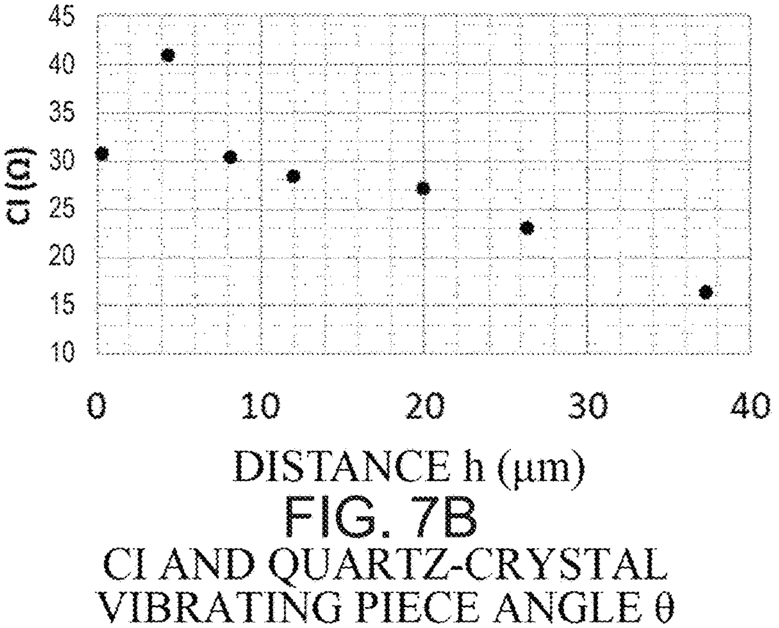
Figure 7C:
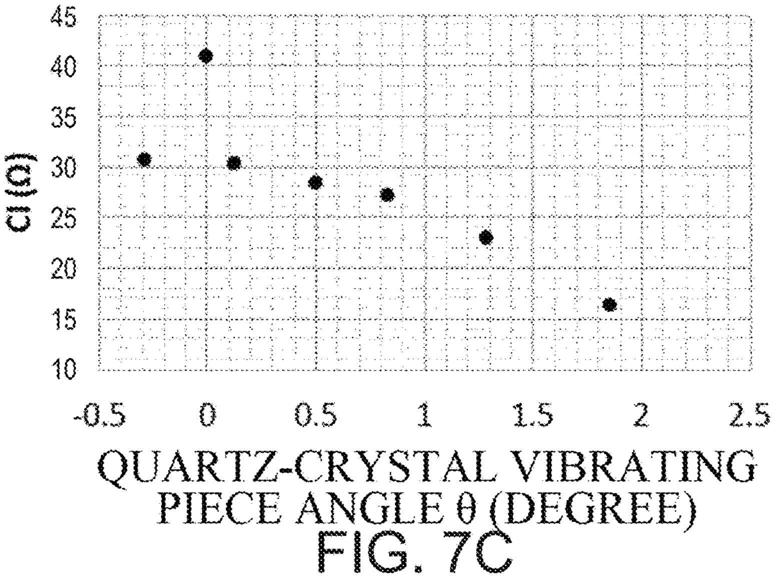

3-1-4. Distance Between Quartz-Crystal Vibrating Piece and Pedestal, and Angle Formed by them The following evaluation was performed as another evaluation. FIG. 7A to FIG. 7C are drawings for the description thereof. Respective crystal impedances (CI) of the samples of Example prototyped in the paragraph 3-1-1 described above were measured. As illustrated in FIG. 7A, a distance h between the distal end of the quartz-crystal vibrating piece 11 and the pedestal 23 and an angle θ formed by the quartz-crystal vibrating piece 11 and the pedestal 23 were measured for each of the samples.

FIG. 7B is a drawing showing a relationship of the CI to the distance h between the distal end of the quartz-crystal vibrating piece 11 and the pedestal 23 on the basis of the above-described measurement results. From FIG. 7B, it can be said that the CI improves when the distance h is large to some extent. If the distance h is small, there is a concern of a failure, such as a damage, caused by the distal end of the quartz-crystal vibrating piece 11 contacting the pedestal 23 when an impact affects the crystal unit, and therefore, the distance h is preferred to be large to some extent from this point of view.

In the case of this example, it is said that the distance h should be set to an appropriate value that is equal to or more than 20 μm and takes the limitation of the container in the height direction and the like into account from FIG. 7B. Considering this respect with the thickness of the quartz-crystal vibrating piece prototyped this time of 22 μm, it is also said that the distance h should be set to an appropriate value that is equal to or more than 20/22≈0.9t with respect to the thickness t of the quartz-crystal vibrating piece.

FIG. 7C is a drawing showing a relationship of the CI to the angle θ formed by the quartz-crystal vibrating piece 11 and the pedestal 23 on the basis of the above-described measurement results. From FIG. 7C, it can be said that the CI improves when the angle θ is large to some extent. As described above, it can be said that the angle θ is preferred to be large to some extent also from the view point of enhancing the impact resistance. In the case of this example, it can be said from FIG. 7C that the angle θ should be an appropriate angle of 0.5 degrees or more.

It is considered that the conductive adhesive 25 is less likely to flow to the center side of the quartz-crystal vibrating piece 11 if the distance h or the angle θ is set to be large to some extent, thereby being considered to successfully reduce the effect of the conductive adhesive to the vibrator to allow suppression of degraded CI.

When the distance h is small, a negative effect of stray capacitance from the pedestal to the excitation electrode occurs in some cases, and therefore, the distance h should be large to some extent by taking the countermeasure thereof into account.

3-1-5. Size and Shape of Pedestal

The embodiments described above have described the examples in which the pedestal is larger than the quartz-crystal vibrating piece. However, it is considered that the pedestal does not have to be that large as long as it is in the range where the effect of the heat stress to the quartz-crystal vibrating piece can be reduced and there is no problem in adhesive strength, and from the reason of, for example, avoiding the contact between the quartz-crystal vibrating piece and the pedestal. The pedestal does not have to be that large even when the effects of the distance h and the angle θ described above are taken into account. Accordingly, the consideration relating to the size of the pedestal will be described below with reference to FIG. 8A.

Figure 8A:
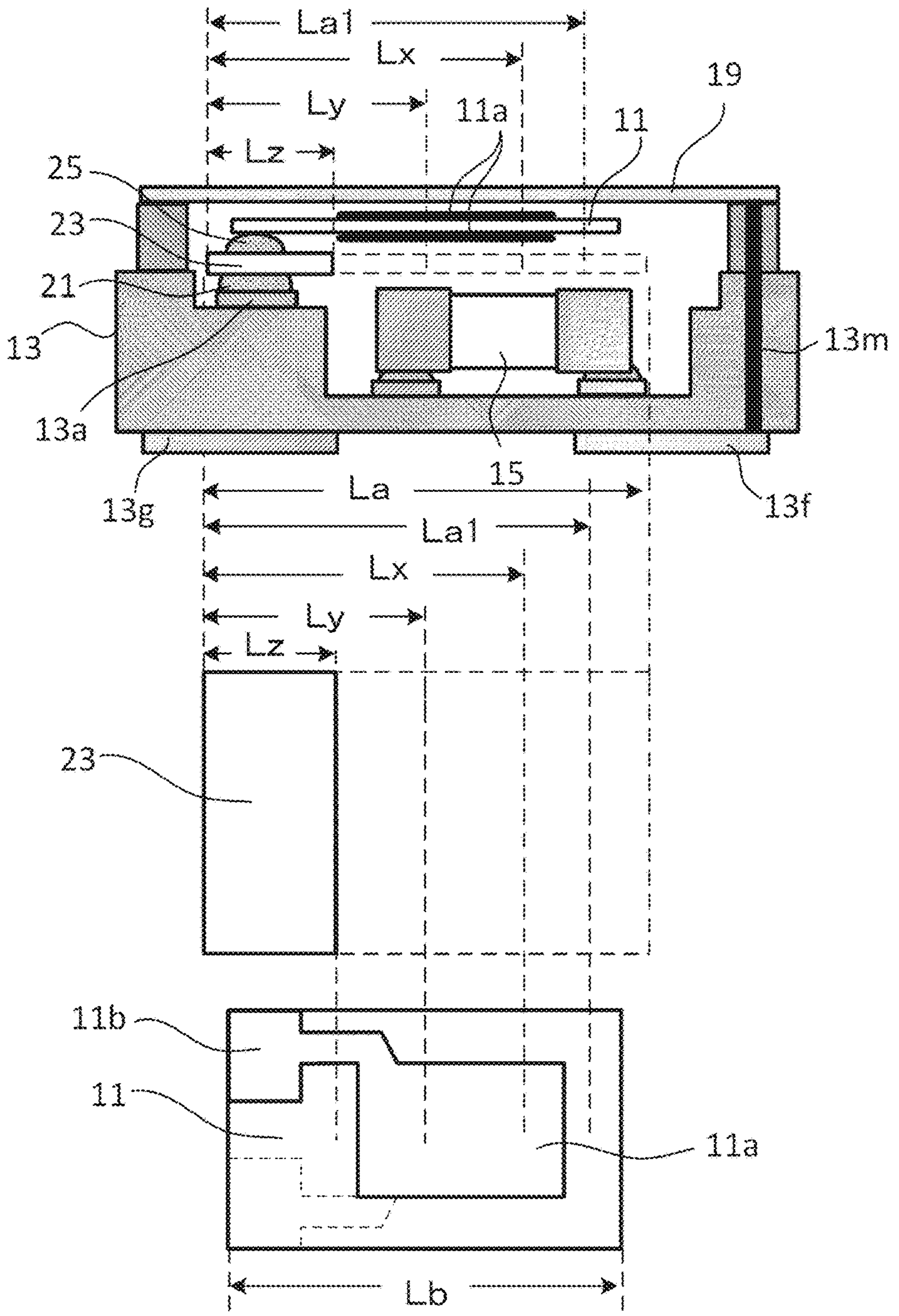
FIG. 8A to FIG. 8C are drawings for describing a dimension of the pedestal made of the crystal with respect to the quartz-crystal vibrating piece and an excitation electrode, and a modification of a pedestal structure.

FIG. 8A is a drawing illustrating a sectional drawing of the crystal unit 10 corresponding to FIG. 1B, a plan view of the pedestal 23, and a plan view of the quartz-crystal vibrating piece 11 together. A long side dimension of the quartz-crystal vibrating piece 11 is Lb, and various dimension examples of the pedestal on the long side are indicated.

That is, FIG. 8A illustrates four examples (La1, Lx, Ly, Lz) having different distal end positions of the pedestal 23 with respect to the distal end position of the quartz-crystal vibrating piece 11 and the distal end position of the excitation electrode 11*a*. In other words, the four examples in which the longitudinal direction dimensions of the pedestals are shorter than the same dimension of the quartz-crystal vibrating piece are illustrated.

A first example has a long side dimension La1 of the pedestal with which the distal end position of the pedestal 23 is positioned between the distal end position of the quartz-crystal vibrating piece and the distal end position of the excitation electrode.

A second example has a long side dimension Lx of the pedestal with which the distal end position of the pedestal 23 is positioned between the distal end position of the excitation electrode and the center position of the excitation electrode.

A third example has a long side dimension Ly of the pedestal with which the distal end position of the pedestal 23 is positioned between the center position of the excitation electrode and a position at an end of the excitation electrode on a side of the conductive adhesive 25.

A fourth example has a long side dimension Lz of the pedestal with which the distal end position of the pedestal 23 is positioned between the position at the end of the excitation electrode on the side of the conductive adhesive 25 and the conductive adhesive 25.

Selecting any one of La1, Lx, Ly, or Lz for the long side dimension of the pedestal may be determined corresponding to the design of the crystal unit 10. However, it is considered that the long side dimension of the pedestal should be Lz described above when considering that the pedestal is only necessary to be in the range where the reduction of effect of the heat stress to the quartz-crystal vibrating piece and the like are achieved and there is no problem in adhesive strength. That is, it is considered that the distal end position of the pedestal should be positioned between the position at the end of the excitation electrode on the side of the conductive adhesive 25 and the conductive adhesive 25 so as to avoid the pedestal 23 from being opposed to the excitation electrode 11*a*.

Figure 8B:
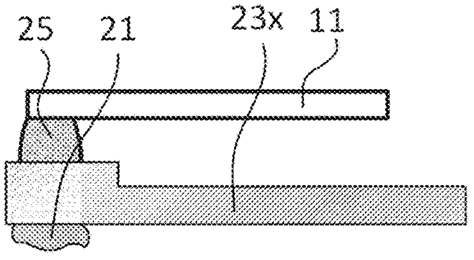
Figure 8C:
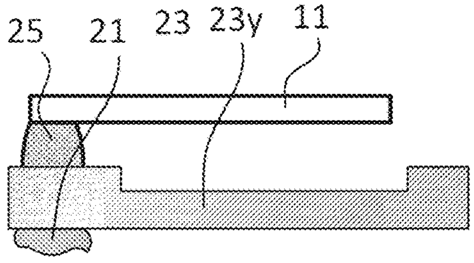

For the three-dimensional structure of the pedestal, as illustrated in FIG. 8B and FIG. 8C, the pedestal may be a pedestal 23*x* (FIG. 8B) having the thickness of the pedestal thinned from a middle in the longitudinal direction to the other end, for example, from a near side opposed to the excitation electrode to the other end, or a pedestal 23*y* (FIG. 8C) having the thickness of the pedestal thinned in a central region in the longitudinal direction, for example, in a region a bit larger than a region opposed to the excitation electrode.

Figure 9A:
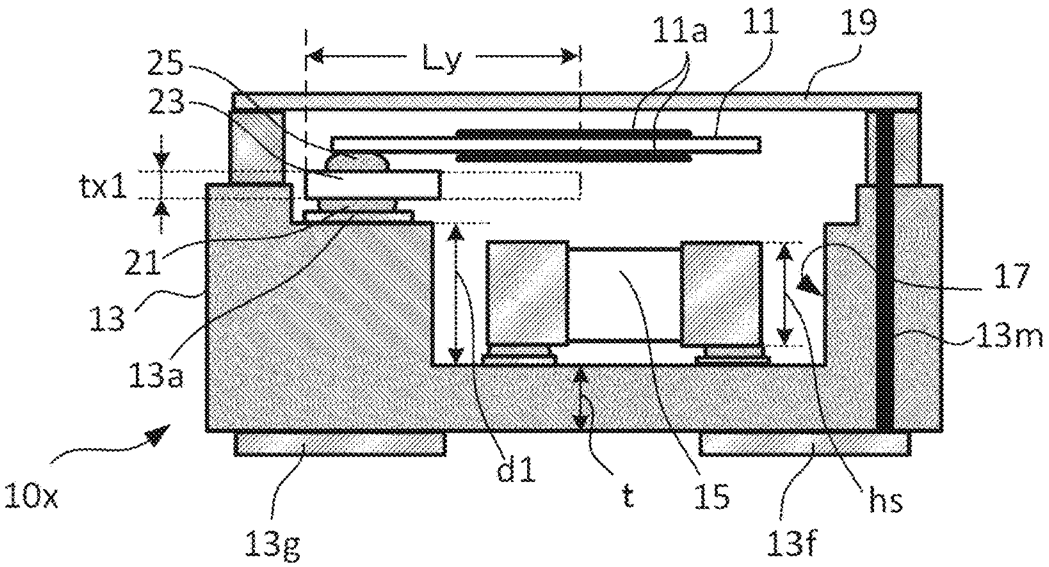
FIG. 9A to FIG. 9C are drawings for describing preferable examples of a relationship between a depth of a depressed portion for a temperature sensor and a thickness of the pedestal made of the crystal.
Figure 9B:
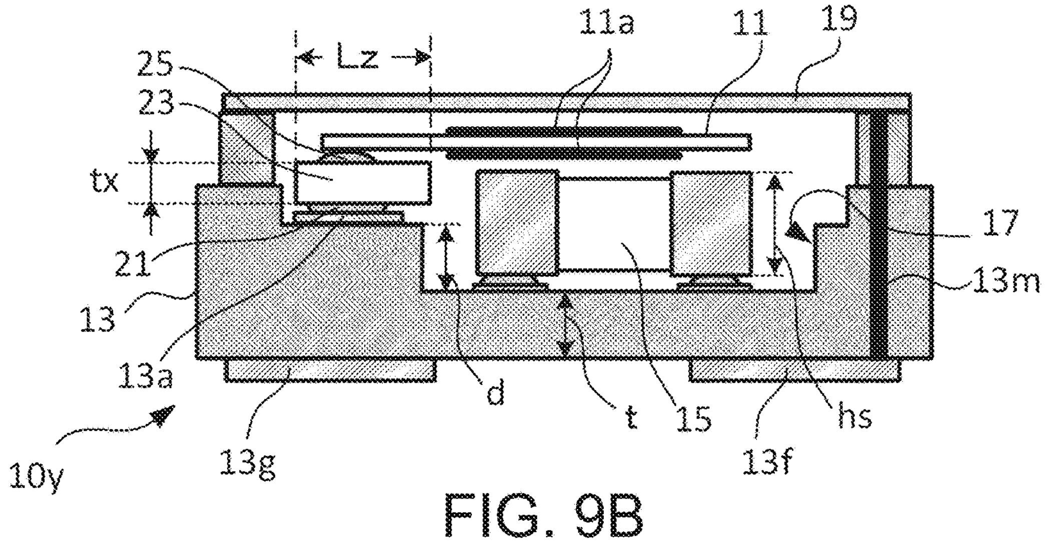
Figure 9C:
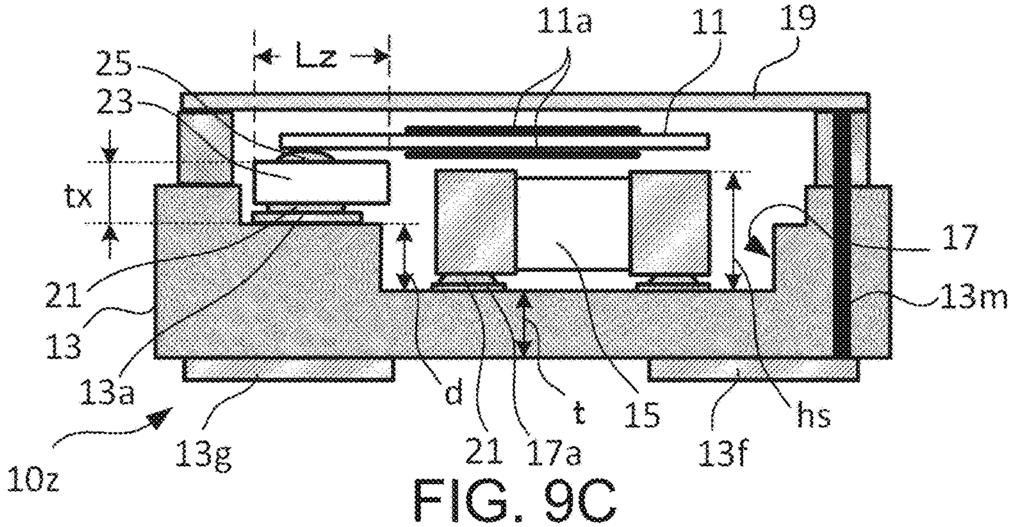

4. Relationship Between Depth of Depressed Portion in which Temperature Sensor is Mounted and Thickness of Pedestal Made of Crystal Next, a preferable example relating to a relationship between a depth of the depressed portion for mounting the temperature sensor (also sometimes referred to as the depressed portion in short) and a thickness of the pedestal made of the crystal (also sometimes referred to as the pedestal in short) will be described. This is described with reference to FIG. 9A to FIG. 9C. Here, each of FIG. 9A and FIG. 9B are sectional drawings of crystal units 10*x*, 10*y* in similar positions to that in FIG. 1B. FIG. 9C is a drawing describing a range of definitions of a thickness tx of the pedestal and a height hs of the temperature sensor 15 with respect to the crystal unit 10*y* illustrated in FIG. 9B.

When a depth of the depressed portion for mounting the temperature sensor is d1 and a height of the temperature sensor is represented as hs, the crystal unit 10*x* illustrated in FIG. 9A has $d1>hs$.

In the case of this crystal unit 10*x*, $d1>hs$, and therefore, the temperature sensor 15 has a space in an upper side compared with the otherwise case. Accordingly, there is even a case where the pedestal 23 reaches between the quartz-crystal vibrating piece 11 and the temperature sensor 15 (the case like Ly in FIG. 9A), the risk of the pedestal contacting the temperature sensor is low. In the case of this crystal unit 10*x*, when the thickness of the pedestal 23 is represented as tx1, the thickness tx1 of the pedestal 23 is allowed to be set to any preferred value. Note that when a thickness of a bottom plate of the container 13 is represented as t, the thickness t is a thickness that can ensure a mechanical strength of the container 13.

When the depth of the depressed portion for mounting the temperature sensor is represented as d, the height of the temperature sensor is represented as hs, and the thickness of the pedestal 23 is represented as tx, the crystal unit 10*y* illustrated in FIG. 9B is $d \leq hs$ and $(d+tx)>hs$.

In the case of this crystal unit 10*y*, the depth of the depressed portion 17 can be made shallow compared with the crystal unit 10*x* in FIG. 9A, which is preferable as one way of reducing the thickness of the entire crystal unit. That is, it is advantageous in thinning the crystal unit. If the depth d of the depressed portion can be made shallow, the operation of mounting the temperature sensor in the depressed portion is facilitated. However, the dimension Lz of the pedestal 23 needs to be determined such that the pedestal 23 does not contact the temperature sensor 15.

A crystal unit 10*z* illustrated in FIG. 9C indicates that the thickness tx of the pedestal may have a thickness including the thickness of the adhesion pad 13*a* and the thickness of the first conductive adhesive 21, and the height hs of the temperature sensor 15 may have a thickness including the thickness of the connecting terminal 17*a* and the thickness of the first conductive adhesive 21. The respect that the height hs of the temperature sensor 15 may have the thickness including the thickness of the connecting terminal 17*a* and the thickness of the first conductive adhesive 21 is also applicable to the crystal unit 10*x* illustrated in FIG. 9A.

5. Regarding Depressed Portion for Temperature Sensor

Next, a specific example of the depressed portion 17 for the temperature sensor will be described. This will be described with reference to FIG. 10A and FIG. 10B. Here, FIG. 10A is a plan view of the container 13 similar to that in FIG. 1A, and FIG. 10B jointly illustrates a plan view of the container 13 similar to that in FIG. 1A and a sectional drawing taken along the line XB-XB.

Figure 10A:
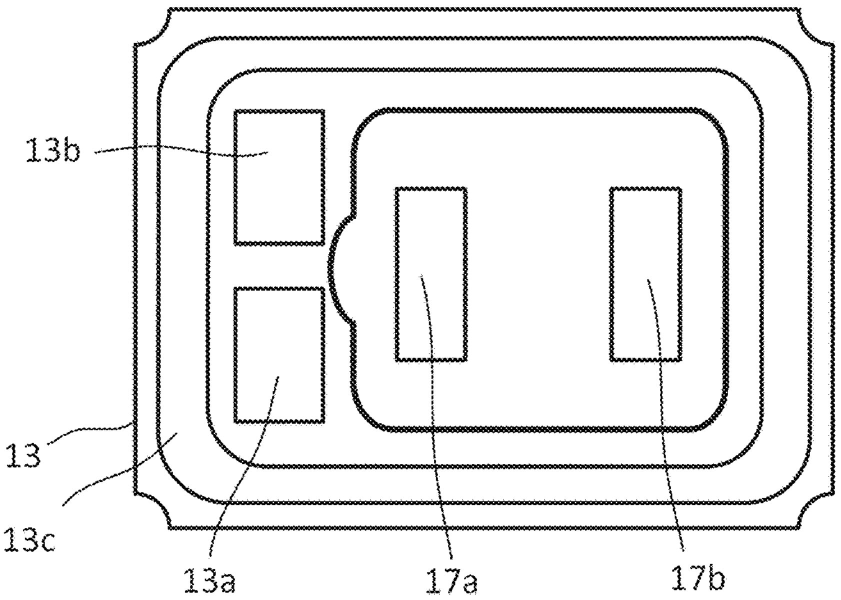
FIG. 10A and FIG. 10B are drawings for describing a specific example of the depressed portion for the temperature sensor.
Figure 10B:
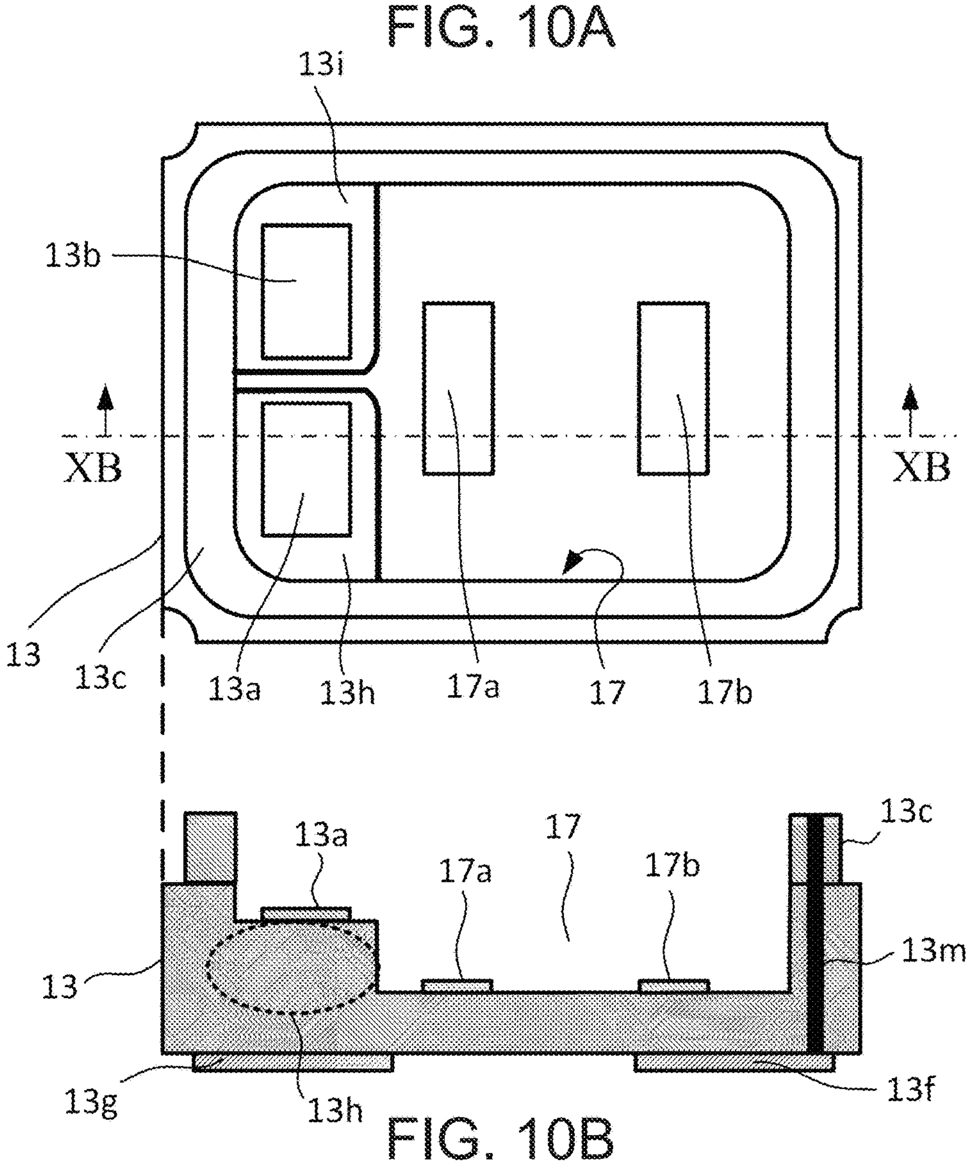

One example of the depressed portion 17 referred in this disclosure is the depressed portion that is planarly obstructed and has a predetermined depth (the depth d1 and the depth d illustrated in FIG. 9A to FIG. 9C) as illustrated in FIG. 10A. Another example of the depressed portion 17 may have, as illustrated in FIG. 10B, the portions of the container 13 where the adhesion pad 13*a* and the adhesion pad 13*b*, which adhere the quartz-crystal vibrating piece, are disposed serving as an extruding part 13*h*, an extruding part 13*i* and portions other than the extruding parts 13*h*, 13*i* being lower to play a role of a depressed portion. The former (FIG. 10A) has the depressed portion 17 planarly obstructed, and therefore, the strength of the container is easily increased compared with the otherwise case. The latter (FIG. 10B) can widen a planar area on which the temperature sensor 15 is mounted compared with the former.

6. Regarding Quartz-Crystal Vibrating Piece

While the quartz-crystal vibrating piece 11 described with reference to FIG. 1A to FIG. 1C, FIG. 2A and FIG. 2B, and the like has a uniform thickness and a planar shape in a rectangular shape, the shape of the crystal unit is not limited to the example described above.

Figure 11A:
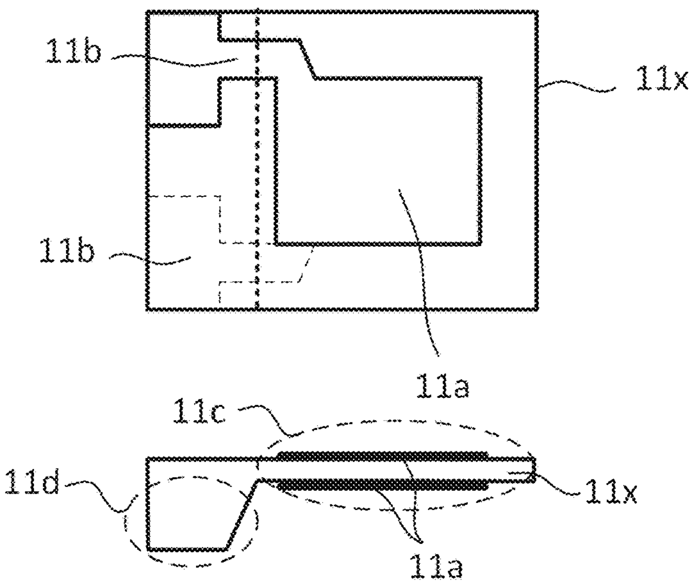
FIG. 11A to FIG. 11C are drawings for describing a specific example of the quartz-crystal vibrating piece.
Figure 11B:
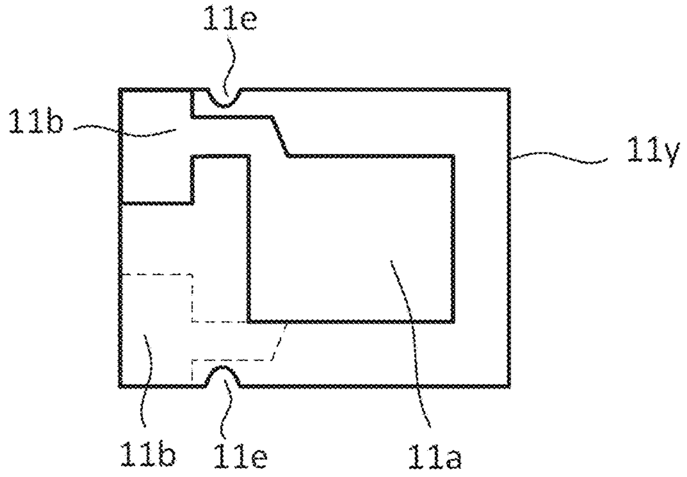
Figure 11C:
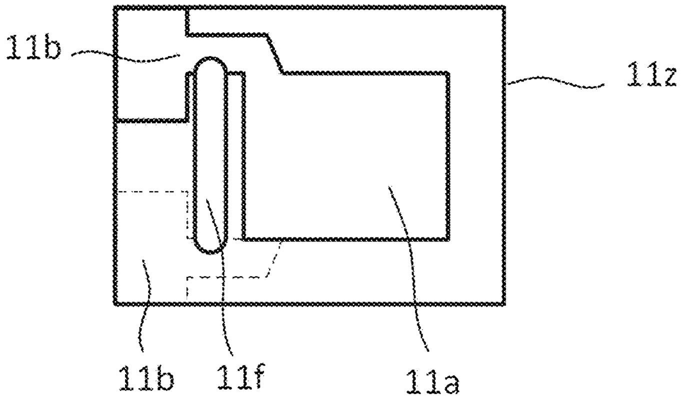

For example, as illustrated in FIG. 11A, a quartz-crystal vibrating piece having, what is called, a single-side moment frame structure that has a vibrator 11*c* having a thickness corresponding to a frequency and a supporting portion 11*d* having a thickness thicker than that of the vibrator 11*c* is also allowed. As illustrated in FIG. 11B, a quartz-crystal vibrating piece having a structure with a cut-out portion 11*e* between a vibrator and a supporting portion of the quartz-crystal vibrating piece is also allowed. As illustrated in FIG. 11C, a quartz-crystal vibrating piece having a structure with a through hole 11*f* between a vibrator and a supporting portion of the quartz-crystal vibrating piece is also allowed. The cut-out portion 11*e* and a through hole 11*f* may be disposed on a quartz-crystal vibrating piece having a uniform thickness or may be disposed on a quartz-crystal vibrating piece having the single-side moment frame structure illustrated in FIG. 11A.

While the above-described embodiment has described the example in which the oscillation frequency is 76.8 MHz, the present disclosure is applicable even in the case of another frequency. For example, the present disclosure is effective to those with 50 MHz band proven as a crystal unit with a built-in temperature sensor. Furthermore, the present disclosure is more and more effective to those with further high frequency, which will be utilized in the future, for example, those with 153 MHz band, 306 MHz band, and the like.

While the above-described embodiments exemplarily described those having the outside dimension of the package in a 1612 size, the present disclosure is applicable to those in other sizes. The present disclosure is applicable to those having the outside dimension of the package in a 1210 size, in a 1008 size, in a further smaller size, and in a size larger than the 1612 size. In the case of those in a small size in particular, the effect of the heat stress further increases as the quartz-crystal vibrating piece is smaller, and therefore, it is considered that the application of the present disclosure facilitates achieving reduction of the heat stress.

While in the embodiment described above, the temperature sensor is mounted in the depressed portion such that the longitudinal direction of the temperature sensor is parallel to the longitudinal direction of the container, the arrangement direction of the temperature sensor is not limited thereto, and the temperature sensor may be mounted in the depressed portion such that, for example, the longitudinal direction of the temperature sensor is parallel to a short side direction of the container.

7. Another Preferable Container and Another Preferable Pedestal

The above-described embodiments have exemplarily described the container 13 described with reference to FIG. 1A, FIG. 1B, and the like as one example of the container. That is, there has been exemplarily described the container having the depressed portion 17 for the temperature sensor 15, the dike 13*c* made of a ceramic surrounding the space housing the quartz-crystal vibrating piece 11, and the seal ring (not illustrated) on the top surface of the dike 13*c*. As one example of the pedestal, the pedestal 23 described with reference to FIG. 3, FIG. 8A to FIG. 8C, and the like has been exemplarily described. That is, the pedestal 23 in the rectangular shape in plan view having the wiring 23*a*1 and the like extracted to the side surface on the dike 13*c* side of the container 13 has been exemplarily described.

Figure 12A:
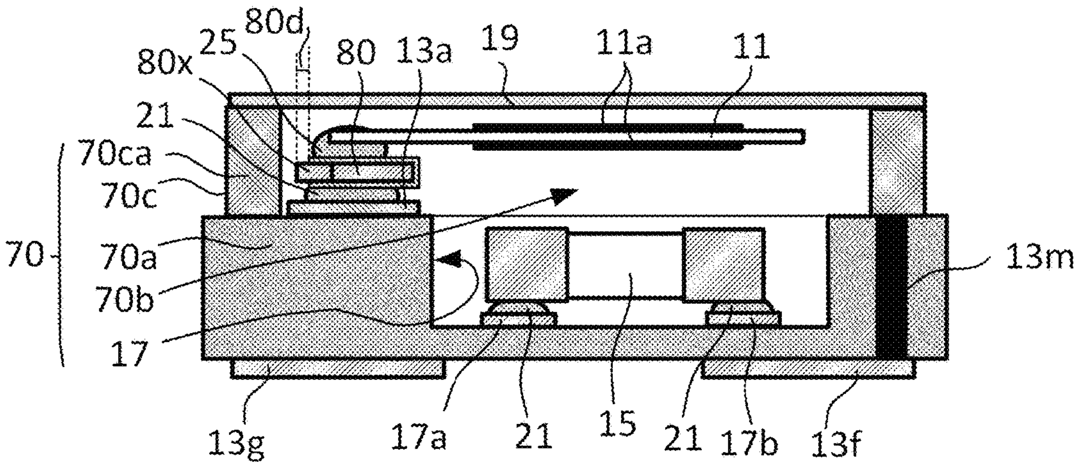
FIG. 12A and FIG. 12B are drawings for describing a preferable container and a preferable pedestal.
Figure 12B:
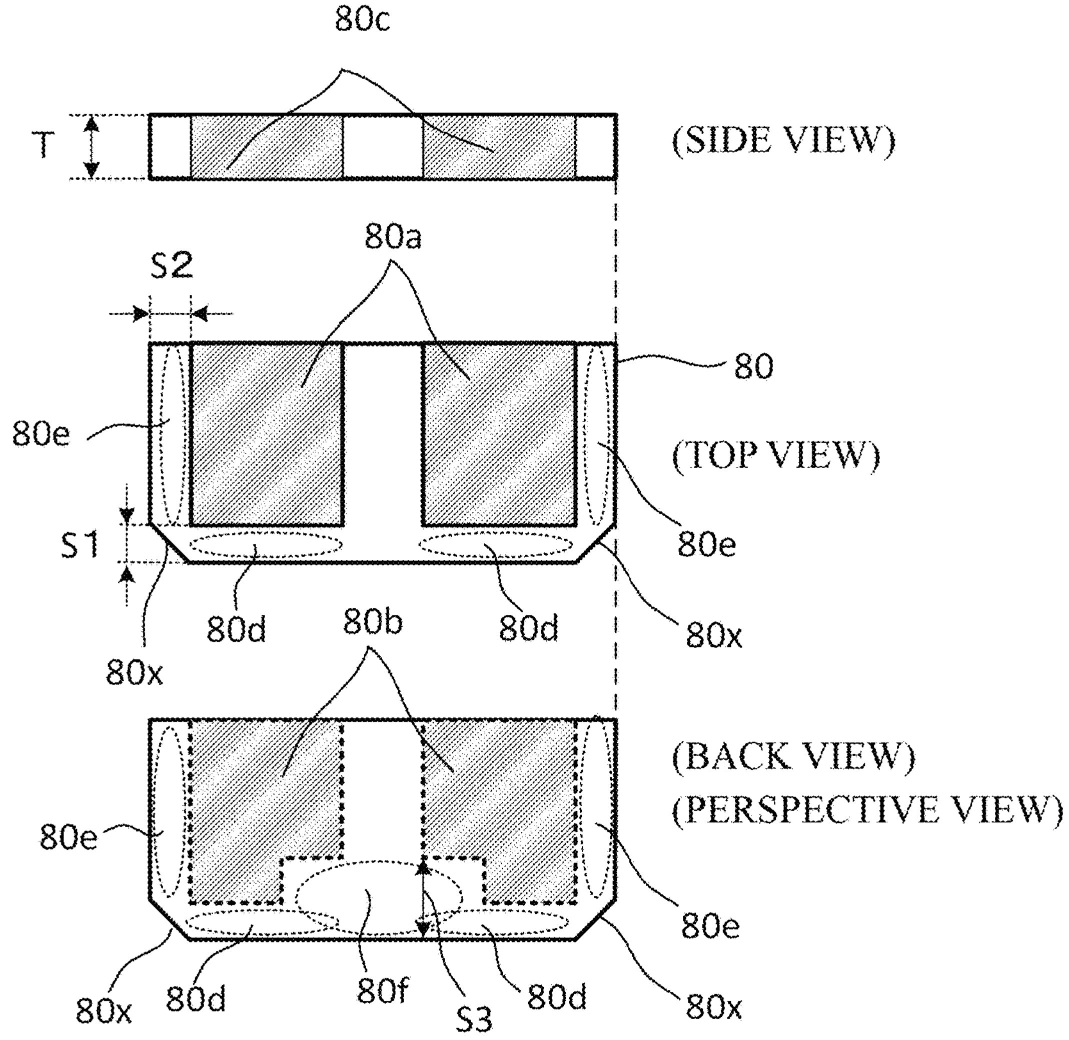

However, when further characteristic improvement and size reduction of the piezoelectric device are attempted, for example, the container and the pedestal having the following structures are preferred. The following describes those with reference to FIG. 12A and FIG. 12B. Here, FIG. 12A is a sectional drawing corresponding to FIG. 1B in order to describe a preferred container 70. FIG. 12B is a side view, a top view, and a back view (a perspective view) in order to describe a preferred pedestal 80.

The preferred container 70 includes a main body portion 70*a* made of a ceramic having the depressed portion 17 (also referred to as the second depressed portion 17) for mounting the temperature sensor 15, and a ring-shaped member 70*c* made of a metal that is connected to the main body portion 70*a* and serves as a side wall that forms a first depressed portion 70*b* for housing the quartz-crystal vibrating piece 11. The first depressed portion 70*b* has a planar shape in a quadrilateral shape and a size wider than a size of the second depressed portion 17. In detail, the main body portion 70*a* has a planar shape in a quadrilateral shape, specifically a rectangular shape, and includes the second depressed portion 17 at a position slightly eccentric from the center in the longitudinal direction. The ring-shaped member 70*c* made of the metal is connected to the main body portion 70*a* with, for example, a brazing material along an edge of a surface of the main body portion 70*a* on a side of the second depressed portion 17. Accordingly, the ring-shaped member 70*c* made of the metal constitutes the side wall of the first depressed portion 70*b*. Therefore, a planar shape of the ring-shaped member 70*c* made of the metal has a shape similar to the dike 13*c* as illustrated in FIG. 1A. The ring-shaped member 70*c* made of the metal is typically made of a kovar material. Also, as illustrated in FIG. 12A, the conductor 13*m* is embedded in a predetermined position of the main body portion 70*a* made of a ceramic for electrically connecting the ring-shaped member 70*c* made of the metal with the terminal 13*f*, which is one terminal among the external connecting terminals. The external connecting terminal 13*f* is connected to a ground of an electronic device (not illustrated) connected to the crystal unit 10 and this connecting structure can ensure an electromagnetic shield structure of the crystal unit 10.

The two adhesion pads 13*a*, 13*b* (see FIG. 1A to FIG. 1C) are provided on and along a portion of the main body portion 70*a* on a side of a first side wall 70*ca* corresponding to a first side of the ring-shaped member 70*c*.

In the case of this preferred container 70, the depressed portion 70*b* in which the quartz-crystal vibrating piece 11 is mounted, that is, the first depressed portion 70*b* is surrounded by the ring-shaped member 70*c* made of the metal, and thus, in combination with the metallic lid as the lid member 19, advantages of a stronger electromagnetic shield and the like are obtainable. Accordingly, electromagnetic shield resistance of the crystal unit can be enhanced. The depressed portion 70*b* (cavity) region in which the quartz-crystal vibrating piece 11 is mounted can be defined by the metallic ring, and therefore, a desired depressed portion can be easily formed. Furthermore, while the crystal unit 10 according to the embodiment, as illustrated in FIG. 1A, uses the dike 13*c* and seal rings (not illustrated), in the case of the container 70, the use of the ring-shaped member made of the metal instead of the dike 13*c* makes it easier to achieve a low profile of the crystal unit.

On the other hand, the preferred pedestal 80 includes first wiring patterns 80*a* for connection with the quartz-crystal vibrating piece on a first surface, second wiring patterns 80*b* for connection with the container, specifically for connection with the two adhesion pads 13*a*, 13*b* on a second surface opposite of the first surface, and third wiring patterns 80*c* that connect the first wiring patterns 80*a* and the second wiring patterns 80*b* to the side wall, and the third wiring patterns 80*c* are provided on a side wall of the pedestal 80 positioned on the opposite side of a side wall opposed to the first side wall 70*ca*.

The preferred pedestal 80 further includes cut-out portions 80*x* at two ends of the side wall opposed to the first side wall 70*ca*. The cut-out portion 80*x* is preferably constituted of a C-chamfered portion. The size of the cut-out portion 80*x* is not limited thereto, for example, is 20 μm to 70 μm in C-dimension, and is preferably approximately 30 μm to 50 μm.

Each of the first wiring pattern 80*a* and the second wiring pattern 80*b* includes a retreat portion 80*d* that retreats from an edge of the pedestal 80 to the center side on at least the first side wall 70*ca* side of the pedestal 80. The retreat portion 80*d* has a retreat dimension S1 that is only necessary to be a dimension enough for avoiding the first wiring pattern 80*a* from contacting (short-circuiting) the metallic ring-shaped member 70*c* even when the pedestal 80 contacts the metallic ring-shaped member 70*c*. If the retreat dimension S1 is too large, the areas of the wiring patterns are reduced, which is unpreferable. The dimension is not limited thereto, and the retreat dimension S1 is preferably, for example, approximately 30 μm to 50 μm.

Each of the first wiring pattern 80*a* and the second wiring pattern 80*b* further includes a retreat portion 80*e* on the pedestal 80 on a side of two side walls intersecting with the side wall opposed to the first side wall 70*ca* of the container. The retreat portion 80*e* has a retreat dimension S2 that may be determined similarly to the above-described dimension S1. S1 and S2 may have the same dimension or may have different dimensions. In addition to the retreat portion 80*d*, the second wiring pattern 80*b* has a retreat portion 80*f* having a retreat dimension S3 larger than the retreat dimension of the retreat portion 80*d* in a center side of the pedestal 80 from the edge of the pedestal 80 near the center of the side where the retreat portion 80*d* of the pedestal 80 is provided. This retreat portion 80*f* is a retreat portion for avoiding the second wiring pattern 80*b* from being damaged by a snapping tool used when each pedestal is snapped off from a wafer after a large number of the pedestals 80 are manufactured in a wafer form. The width and the retreat dimension S3 of this retreat portion 80*f* are determined by taking the size of the snapping tool into account. However, if the width and the retreat dimension S3 of the retreat portion 80*f* are too large, the area of the second wiring pattern 80*b* becomes narrow, which is unpreferable in terms of conductivity, and therefore, this should also be considered for these dimensions.

With the above-described preferred pedestal 80, the pedestal 80 can be arranged close to the edge of the wall of the container 70 even when the container 70 having the side wall of the first depressed portion 70*b* constituted of the metallic ring-shaped member 70*c* is used. This is because the preferred pedestal 80 includes the above-described predetermined retreat portion 80*d* and the like and/or the cut-out portion 80*x*, even though the pedestal is arranged close to the edge of the wall of the container 70, the first wiring pattern 80*a*, the second wiring pattern 80*b*, and the third wiring pattern 80*c* of the pedestal 80 are not short-circuited with the metallic ring-shaped member 70*c*. Accordingly, the pedestal 80 can be easily mounted even if the mounting margin onto the container 70 is reduced due to the increasingly reduced size of the crystal unit.

The preferred container 70 and the preferred pedestal 80 may be used instead of the first chamber 13*x*1 and the pedestal 23 of the crystal unit 50 with a built-in temperature sensor in the H-shaped structure described with reference to FIG. 5A and FIG. 5B, or may surely be used instead of the container 13 and the pedestal 23 of the various crystal units described with reference to FIG. 9A to FIG. 9C.

With the first disclosure and the second disclosure of the application, the crystal unit with the built-in temperature sensor in which a cantilever support structure is heavily used is achievable. In the cantilever support structure, the pedestal made of the crystal is adhered to the adhesion pads in the container or the first chamber in a cantilever manner, and the AT-cut quartz-crystal vibrating piece is adhered to this pedestal made of the crystal in a cantilever manner.

Moreover, the crystal unit with the built-in temperature sensor that has the structure in which, depending on whether the quartz-crystal vibrating piece is connected to the pedestal at the two positions along the X-axis of the crystal or is connected to the pedestal at the two positions along the Z'-axis of the crystal, the pedestal made of the crystal that has the axis corresponding to this axis in the direction parallel to the plane is used, and the quartz-crystal vibrating piece and the pedestal made of the crystal are adhered in the positional relationship in which the crystallographic axis of the quartz-crystal vibrating piece and the crystallographic axis of the pedestal are in the parallel relationship is achievable. Accordingly, the quartz-crystal vibrating piece and the pedestal made of the crystal can be arranged in a state where the crystallographic conditions of the quartz-crystal vibrating piece and the pedestal made of the crystal in the portions between the two bonding points considered to be the most susceptible to the effects of the heat stress and the like are close to one another. Therefore, the effects of thermal expansion coefficients and the like can be reduced compared with the otherwise case.

Accordingly, with the cantilever support structure and the structure using the predetermined pedestal made of the crystal, the heat stress and the like can be reduced, and therefore, there can be provided the crystal unit with the built-in temperature sensor having the novel structure that can improve the hysteresis of the frequency versus temperature characteristics of the quartz-crystal vibrating piece compared with the conventional one.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal unit with a built-in temperature sensor in a single chamber structure, comprising:
- a container, in which an AT-cut quartz-crystal vibrating piece is mounted;
- a depressed portion, disposed in a portion on a bottom surface side of the container, the depressed portion being for mounting a temperature sensor;
- the AT-cut quartz-crystal vibrating piece, being in a quadrilateral shape in plan view and mounted in the container;
- the temperature sensor, mounted in the depressed portion;
- two adhesion pads, disposed at portions corresponding to a peripheral area of the depressed portion of the container along a first direction; and
- a pedestal made of a crystal, disposed between the two adhesion pads and the AT-cut quartz-crystal vibrating piece, adhered to the two adhesion pads on one end side of one surface, and adhered to the AT-cut quartz-crystal vibrating piece at two positions along an X-axis of a crystal or at two positions along a Z'-axis of the crystal on the other surface, wherein depending on whether the AT-cut quartz-crystal vibrating piece is adhered to the pedestal at the two positions along the X-axis or is adhered to the pedestal at the two positions along the Z'-axis, the pedestal made of the crystal has the X-axis or one of the Z'-axis or a Z-axis of the crystal in a direction parallel to a plane, and is adhered to the two adhesion pads in a positional relationship in which the axis of the pedestal is parallel to the first direction, where, the Z'-axis is an axis displaced from a true Z-axis of the crystal derived from a cut angle of an AT-cut crystal element.

2. A crystal unit with a built-in temperature sensor in an H-shaped structure, comprising:
- a first chamber, in which an AT-cut quartz-crystal vibrating piece is mounted;
- a second chamber, in which a temperature sensor is mounted, the second chamber having a bottom surface connected to the first chamber;
- the AT-cut quartz-crystal vibrating piece, being in a quadrilateral shape in plan view mounted in the first chamber;
- the temperature sensor, mounted in the second chamber;
- two adhesion pads, disposed in the first chamber along a first direction; and
- a pedestal made of a crystal, disposed between the two adhesion pads and the AT-cut quartz-crystal vibrating piece, adhered to the two adhesion pads on one end side of one surface, and adhered to the AT-cut quartz-crystal vibrating piece at two positions along an X-axis of a crystal or at two positions along a Z'-axis of the crystal on the other surface, wherein depending on whether the AT-cut quartz-crystal vibrating piece is adhered to the pedestal at the two positions along the X-axis or is adhered to the pedestal at the two positions along the Z'-axis, the pedestal made of the crystal has the X-axis or one of the Z'-axis or a Z-axis parallel to a plane, and is adhered to the two adhesion pads in a positional relationship in which the axis of the pedestal is parallel to the first direction, where, the Z'-axis is an axis displaced from a true Z-axis of the crystal derived from a cut angle of an AT-cut crystal element.

3. The crystal unit according to claim 1, wherein when a thickness of the AT-cut quartz-crystal vibrating piece is represented as t, and a thickness of the pedestal is represented as T, the thickness T of the pedestal is $0.9t \le T \le 3.1t$.

4. The crystal unit according to claim 1, wherein when a thickness of the AT-cut quartz-crystal vibrating piece is represented as t, and a thickness of the pedestal is represented as T, the thickness T of the pedestal is $1.3t \le T \le 2.7t$.

5. The crystal unit according to claim 1, wherein the pedestal is disposed on a side of the adhesion pads with respect to an excitation electrode included in the AT-cut quartz-crystal vibrating piece.

6. The crystal unit according to claim 1, wherein when a thickness of the AT-cut quartz-crystal vibrating piece is represented as t, and a thickness of the pedestal is represented as T, the thickness T of the pedestal is $0.9t \le T \le 3.1t$, and the pedestal is disposed on a side of the adhesion pads with respect to an excitation electrode included in the AT-cut quartz-crystal vibrating piece.

7. The crystal unit according to claim 1, wherein the pedestal has a thickness selected from thicknesses from 30 μm to 60 μm.

8. The crystal unit according to claim 1, wherein the pedestal is an AT-cut crystal element and is adhered to the two adhesion pads at two points along an X-axis of a crystal of the AT-cut crystal element.

9. The crystal unit according to claim 1, wherein the pedestal is an AT-cut crystal element and is adhered to the two adhesion pads at two points along a Z'-axis of a crystal of the AT-cut crystal element.

10. The crystal unit according to claim 1, wherein the pedestal is a Z-cut crystal element and is adhered to the two adhesion pads at two points along an X-axis of a crystal of the Z-cut crystal element.

11. The crystal unit according to claim 3, wherein the pedestal is an AT-cut crystal element and is adhered to the two adhesion pads at two points along an X-axis of a crystal of the AT-cut crystal element.

12. The crystal unit according to claim 3, wherein the pedestal is an AT-cut crystal element and is adhered to the two adhesion pads at two points along a Z'-axis of a crystal of the AT-cut crystal element.

13. The crystal unit according to claim 3, wherein the pedestal is a Z-cut crystal element and is adhered to the two adhesion pads at two points along an X-axis of a crystal of the Z-cut crystal element.

14. The crystal unit according to claim 1, wherein the AT-cut quartz-crystal vibrating piece has an oscillation frequency in 76 MHz band including 76.8 MHz, and the pedestal has a thickness selected from thicknesses of 30 μm to 60 μm.

15. The crystal unit according to claim 5, wherein the AT-cut quartz-crystal vibrating piece has an oscillation frequency in 76 MHz band including 76.8 MHz, and the pedestal has a thickness selected from thicknesses of 30 μm to 60 μm.

16. The crystal unit according to claim 1, wherein when a depth of the depressed portion is represented as d, a height of the temperature sensor is represented as hs, and a thickness of the pedestal is represented as tx, $d<hs$ and $(d+tx)>hs$, and a dimension in a direction perpendicular to the first direction of the pedestal is a dimension that avoids a contact with the temperature sensor.

17. The crystal unit according to claim 1, wherein when a depth of the depressed portion is represented as d, a height of the temperature sensor is represented as hs, and a thickness of the pedestal is represented as tx, $d<hs$ and $(d+tx)>hs$, a dimension in a direction perpendicular to the first direction of the pedestal is a dimension that avoids a contact with the temperature sensor, the AT-cut quartz-crystal vibrating piece has an oscillation frequency in 76 MHz band including 76.8 MHz, and the pedestal has a thickness selected from thicknesses of 30 μm to 60 μm.

18. The crystal unit according to claim 1, wherein when a depth of the depressed portion is represented as d, a height of the temperature sensor is represented as hs, and a thickness of the pedestal is represented as tx, $d<hs$ and $(d+tx)>hs$, a dimension in a direction perpendicular to the first direction of the pedestal is a dimension that avoids a contact with the temperature sensor, the AT-cut quartz-crystal vibrating piece has an oscillation frequency in 76 MHz band including 76.8 MHz, the pedestal has a thickness selected from thicknesses of 30 μm to 60 μm, and the pedestal is an AT-cut crystal element or a Z-cut crystal element.

19. The crystal unit according to claim 1, wherein when a depth of the depressed portion is represented as d, and a height of the temperature sensor is represented as hs, $d>hs$, the pedestal has a thickness selected from thicknesses of 30 μm to 60 μm, and the pedestal is an AT-cut crystal element or a Z-cut crystal element.

20. The crystal unit according to claim 1, wherein when a depth of the depressed portion is represented as d, and a height of the temperature sensor is represented as hs, $d>hs$, the AT-cut quartz-crystal vibrating piece has an oscillation frequency in 76 MHz band including 76.8 MHz, the pedestal has a thickness selected from thicknesses of 30 μm to 60 μm, and the pedestal is an AT-cut crystal element or a Z-cut crystal element.

21. The crystal unit according to claim 1, wherein the container includes:

a main body portion made of a ceramic, having a second depressed portion as the depressed portion for mounting the temperature sensor; and a ring-shaped member made of a metal, the ring-shaped member is connected to the main body portion and serves as a side wall forming a first depressed portion for housing the AT-cut quartz-crystal vibrating piece, and the first depressed portion has a planar shape in a quadrilateral shape and a size wider than a size of the second depressed portion, wherein the two adhesion pads are disposed on a portion of the main body portion on a side of a first side wall corresponding to a first side of the ring-shaped member.

22. The crystal unit according to claim 2, wherein the first chamber includes a ring-shaped member that is made of a metal for housing the AT-cut quartz-crystal vibrating piece and serves as a side wall forming a depressed portion having a planar shape in a quadrilateral shape, and the two adhesion pads are disposed on a portion of the first chamber on a side of a first side wall corresponding to a first side of the ring-shaped member.

23. The crystal unit according to claim 1, wherein the container includes:

a main body portion made of a ceramic, having a second depressed portion as the depressed portion for mounting the temperature sensor; and a ring-shaped member made of a metal that is connected to the main body portion and serves as a side wall forming a first depressed portion for housing the AT-cut quartz-crystal vibrating piece, and the first depressed portion has a planar shape in a quadrilateral shape and a size wider than a size of the second depressed portion, wherein the two adhesion pads are disposed on a portion of the main body portion on a side of a first side wall corresponding to a first side of the ring-shaped member, and wherein the pedestal includes:

a first wiring pattern for connection with the AT-cut quartz-crystal vibrating piece on a first surface;

a second wiring pattern for connection with the container on a second surface opposite of the first surface; and a third wiring pattern that connects the first wiring pattern and the second wiring pattern to a side wall, and the third wiring pattern is disposed on a side wall of the pedestal positioned on an opposite side of a side wall opposed to the first side wall.

24. The crystal unit according to claim 2, wherein the first chamber includes a ring-shaped member that is made of a metal for housing the AT-cut quartz-crystal vibrating piece and serves as a side wall forming a depressed portion having a planar shape in a quadrilateral shape, wherein the two adhesion pads are disposed on a portion of the first chamber on a side of a first side wall corresponding to a first side of the ring-shaped member, and wherein the pedestal includes:

a first wiring pattern for connection with the AT-cut quartz-crystal vibrating piece on a first surface;

a second wiring pattern for connection with the container on a second surface opposite of the first surface; and a third wiring pattern that connects the first wiring pattern and the second wiring pattern to a side wall, and the third wiring pattern is disposed on a side wall of the pedestal positioned on an opposite side of a side wall opposed to the first side wall.

25. The crystal unit according to claim 23, further comprising:

cut-out portions, being disposed at two ends of the side wall of the pedestal opposed to the first side wall.

26. The crystal unit according to claim 23, wherein the first wiring pattern and the second wiring pattern each include a retreat portion that retreats to a center side from an edge of the pedestal at least on a side of the first side wall of the pedestal.

* * * * *